(12) United States Patent
Kim et al.

(10) Patent No.: US 11,089,423 B2
(45) Date of Patent: Aug. 10, 2021

(54) SIGNAL PROCESSING DEVICE AND IMAGE DISPLAY APPARATUS INCLUDING THE SAME

(71) Applicant: LG ELECTRONICS INC., Seoul (KR)

(72) Inventors: Kichul Kim, Seoul (KR); Joonil Lee, Seoul (KR); Jongkun Kim, Seoul (KR); Sunha Jeon, Seoul (KR); Jongha Park, Seoul (KR); Dongyun Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/737,646

(22) Filed: Jan. 8, 2020

(65) Prior Publication Data
US 2020/0221242 A1    Jul. 9, 2020

(30) Foreign Application Priority Data
Jan. 8, 2019    (KR) .......................... 10-2019-0002219

(51) Int. Cl.
*H04R 5/02*    (2006.01)
*H04S 7/00*    (2006.01)
(Continued)

(52) U.S. Cl.
CPC .............. *H04S 7/302* (2013.01); *G10L 25/30* (2013.01); *G10L 25/51* (2013.01); *H04R 3/04* (2013.01);
(Continued)

(58) Field of Classification Search
CPC ......... H04S 7/302; H04S 3/008; G10L 25/30; G10L 25/51; H04R 3/04
See application file for complete search history.

(56) References Cited

U.S. PATENT DOCUMENTS

| 8,446,994 B2 * | 5/2013 | Rawlins ................... H04B 1/30 375/345 |
| 2005/0008170 A1 * | 1/2005 | Pfaffinger ............... H04S 7/301 381/96 |

(Continued)

FOREIGN PATENT DOCUMENTS

| KR | 1020070038020 | 4/2007 |
| KR | 1020120032000 | 4/2012 |
| KR | 1020180069299 | 6/2018 |

OTHER PUBLICATIONS

European Patent Office Application Serial No. 20150690.4, Search Report dated May 12, 2020, 10 pages.

(Continued)

*Primary Examiner* — Simon King
(74) *Attorney, Agent, or Firm* — Lee Hong Degerman Kang & Waimey

(57) ABSTRACT

Disclosed are a signal processing device and an image display apparatus including the same. The signal processing device and an image display apparatus including the same include: a converter configured to convert of frequency of an input stereo audio signal; a primary component analyzer configured to perform primary component analysis based on a signal from the converter; a feature extractor configured to extract a feature of a primary component signal based on a signal from the primary component analyzer; an envelope adjustor configured to perform envelope adjustment based on prediction performed on the basis of a deep neural network model; and an inverse converter configured to inversely convert a signal from the envelope adjustor to output an upmix audio signal of multi-channel. Accordingly, when upmixing the downmix stereo audio signal to a multichannel audio signal, spatial distortion can be improved.

20 Claims, 17 Drawing Sheets

(51) Int. Cl.
*G10L 25/30* (2013.01)
*G10L 25/51* (2013.01)
*H04R 3/04* (2006.01)
*H04S 3/00* (2006.01)

(52) U.S. Cl.
CPC .......... *H04S 3/008* (2013.01); *H04S 2400/01* (2013.01); *H04S 2400/11* (2013.01)

(56) References Cited

U.S. PATENT DOCUMENTS

| | | | |
|---|---|---|---|
| 2005/0091051 A1* | 4/2005 | Moriya | G10L 19/0017 704/229 |
| 2009/0080666 A1 | 3/2009 | Uhle et al. | |
| 2011/0202354 A1* | 8/2011 | Grill | G10L 19/18 704/500 |
| 2014/0163972 A1 | 6/2014 | Tsujino et al. | |
| 2017/0061978 A1* | 3/2017 | Wang | G10L 21/0232 |
| 2017/0171683 A1* | 6/2017 | Kim | G10L 19/16 |
| 2017/0180160 A1* | 6/2017 | Moorti | H04L 47/29 |

OTHER PUBLICATIONS

PCT International Application No. PCT/KR2020/000335, International Search Report dated May 7, 2020, 3 pages.
Ibrahim, et al., "Primary-Ambient Source Separation for Upmixing To Surround Sound Systems", 2018 IEEE International Conference on Acoustics, Speech and Signal Processing (ICASSP), IEEE, Apr. 2018, 10 pages.
Su Yeon Park, et al., "Subband-Based Upmixing of Stereo to 5.1-Channel Audio Signals Using Deep Neural Networks", 2016 International Conference on Information and Communication Technology Convergence (ICTC), IEEE, Oct. 2016, 10 pages.

* cited by examiner (a)　　　　　　　　　(b)　　　　　　　　　(c)

SIGNAL PROCESSING DEVICE AND IMAGE DISPLAY APPARATUS INCLUDING THE SAME

CROSS-REFERENCE TO RELATED APPLICATION

Pursuant to 35 U.S.C. § 119(a), this application claims benefit of earlier filing date and the right of priority to Korean Patent Application No. 10-2019-0002219, filed on Jan. 8, 2019, the contents of which are all hereby incorporated by reference herein in its entirety.

BACKGROUND OF THE INVENTION

1. Field of the Invention

The present disclosure relates to a signal processing device and an image display apparatus including the same, and more particularly, to a signal processing device capable of improving spatial distortion when upmixing a downmix stereo audio signal to a multi-channel audio signal, and an image display apparatus including the same.

2. Description of the Related Art

A signal processing device is an apparatus that can perform image signal processing or speech signal processing.

Recently, audio codec such as MPEG-H 3D Audio of ATSC 3.0, Dolby AC4, Dolby ATMOS, DTS Virtual:X, and the like has been standardized, and a corresponding rendering technology has been widely used in an audio device such as a mobile terminal, a home theater, and an image display apparatus.

That is, the paradigm is changing from the conventional multi-channel audio codec to an immersive audio codec.

In addition, an audio playing apparatus extended a two channel configured for a pair of left and right speakers to a 5.1, 7.1 channel, or the like, in order to reproduce an effective spatial impression, thereby forming a sound field on a two-dimensional plane.

In addition, recently, for realistic audio for ultra-high definition such as UHDTV, it has been further deepened into a multi-channel capable of expressing three-dimensional space such as a 5.1.2 channel or a 22.2 channel.

However, low-quality stereo sound source or multi-channel is downmixed and delivered to consumers, due to problems such as high cost of contents production, transmission equipment for transmitting contents to consumers, constraints of wired and wireless environments, and price competitiveness of audio play apparatus.

In order to effectively play such a downmix two-channel stereo sound source in a multichannel audio play apparatus, a multichannel upmix method is required.

A method of separating again a signal in which several channels or sound sources are combined into individual channels or sources is referred to as a Blind Upmix, Blind Source Separation method.

The Blind Upmix, Source Separation method may include an Independent Component Analysis (ICA) method that perform analysis based on the assumption that audio sources have independent characteristics, a Primary Component Analysis (PCA) method that perform analysis using primary component and ambient component signals, and a Nonnegative Matrix Factorization (NMF) method based on unsupervised learning.

Meanwhile, according to the primary component analysis method (PCA), since the signal separated into the primary component and the ambient component is different from an original multichannel, it is impossible to match the primary component and the ambient component to the original multichannel signal.

For example, in a multi-channel play apparatus, if the primary component is distributed in the front channel and the ambient component is evenly distributed in the entire channel, or if they are rendered in the rear, upstream channel, differently from the actual intention of the content creator, distorted spatial sound characteristic appears such that the audio object is positioned only in the front.

Meanwhile, since the method based on ICA, NMF, and the like also decomposes a signal based on an independent component and a base component, it is difficult to match to a multi-channel such as the actual front, center, woofer, rear, and upstream.

SUMMARY OF THE INVENTION

An object of the present disclosure is to provide a signal processing device capable of improving spatial distortion when upmixing a downmix stereo audio signal to a multi-channel audio signal, and an image display apparatus having the same.

Another object of the present disclosure is to provide a signal processing device capable of synthesizing a multi-channel signal using a primary component analysis method and a deep neural network model, and an image display apparatus having the same.

In order to achieve the above objects, a signal processing device and an image display apparatus including the same according to an embodiment of the present disclosure include: a converter configured to convert of frequency of an input stereo audio signal; a primary component analyzer configured to perform primary component analysis based on a signal from the converter; a feature extractor configured to extract a feature of a primary component signal based on a signal from the primary component analyzer; an envelope adjustor configured to perform envelope adjustment based on prediction performed on the basis of a deep neural network model; and an inverse converter configured to inversely convert a signal from the envelope adjustor to output an upmix audio signal of multi-channel.

The signal processing device and an image display apparatus including the same according to an embodiment of the present disclosure further include a filter bank configured to filter the frequency-converted stereo audio signal from the converter by a plurality of band pass filters.

The signal processing device and an image display apparatus including the same according to an embodiment of the present disclosure further include a model learning predictor configured to perform the prediction based on the deep neural network model based on the feature from the feature extractor.

The signal processing device and an image display apparatus including the same according to an embodiment of the present disclosure further include a masking unit configured to perform masking for prediction result from a model learning predictor.

The masking unit performs masking by using time-frequency component to perform channel separation based on the prediction result from the model learning predictor, when each channel of multichannel is independent of time and frequency.

The envelope adjustor separates a channel by correcting an envelope of a signal in a frequency band, according to a weight function for a frequency band, based on a prediction result from a model learning predictor.

The envelope adjustor adjusts a size of each frequency band to follow an envelope in a target channel.

The primary component analyzer separates a primary component signal and a sub component signal of the input stereo audio signal.

The primary component analyzer performs at least one of a correlation operation between channels of primary component signal of the input stereo audio signal, a panning gain operation of primary component signal, and a power operation of primary component signal.

The feature extractor extracts a panning gain of the primary component signal of the input stereo audio signal and a power of the primary component signal.

The signal processing device and an image display apparatus including the same according to an embodiment of the present disclosure further include a second converter configured to convert of frequency of a downmix stereo audio signal or a multi-channel audio signal received from a database; a second primary component analyzer configured to perform primary component analysis based on a signal from the second converter; and a second feature extractor configured to extract a feature of the primary component signal based on the signal from the second primary component analyzer; wherein learning is performed based on the deep neural network model based on the feature extracted by the second feature extractor.

The signal processing device and an image display apparatus including the same according to an embodiment of the present disclosure further include a model learning predictor configured to perform learning based on the deep neural network model based on the feature extracted by the second feature extractor.

BRIEF DESCRIPTION OF THE DRAWINGS

The embodiments will be described in detail with reference to the following drawings in which like reference numerals refer to like elements wherein.

DETAILED DESCRIPTION OF THE PREFERRED EMBODIMENTS

Hereinafter, the present disclosure will be described in detail with reference to the accompanying drawings.

With respect to constituent elements used in the following description, suffixes "module" and "unit" are given only in consideration of ease in the preparation of the specification, and do not have or serve as different meanings. Accordingly, the suffixes "module" and "unit" may be used interchangeably.

Figure 1:
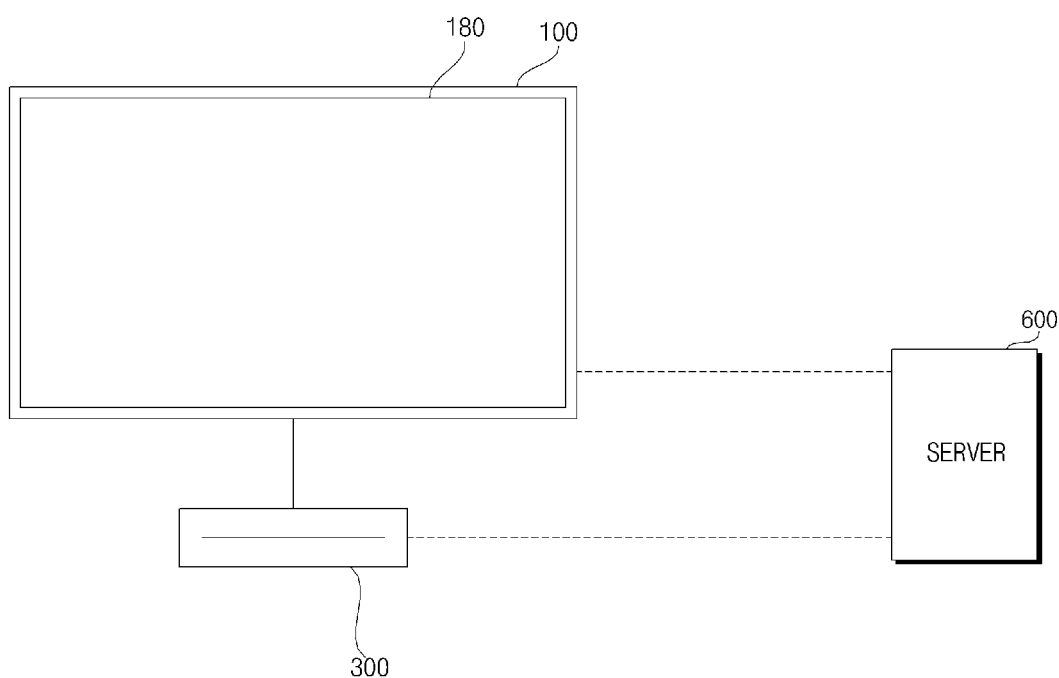
FIG. 1 is a diagram illustrating an image display system according to an embodiment of the present disclosure.

FIG. 1 is a diagram showing an image display system according to an embodiment of the present disclosure.

Referring to the drawing, an image display system 10 according to an embodiment of the present disclosure may include an image display apparatus 100 including a display 180, a set-top box 300, and a server 600.

The image display apparatus 100 according to an embodiment of the present disclosure may receive an image from the set-top box 300 or the server 600.

For example, the image display apparatus 100 may receive an image signal from the set-top box 300 through an HDMI terminal.

For another example, the image display apparatus 100 may receive an image signal from the server 600 through a network terminal.

Meanwhile, the image display apparatus 100 may calculate an original quality of an original quality received through an external set-top box 300 or a network, set an image quality of the image signal according to the calculated original quality, and perform image quality processing on the image signal according to the set image quality.

Meanwhile, the image display apparatus 100 may calculate a resolution and a noise level of a received image signal using a Deep Neural Network (DNN). Accordingly, it is possible to accurately perform the original quality calculation of the received image signal.

Meanwhile, the image display apparatus 100 may update a parameter for the DNN from the server 600, and calculate a resolution and a noise level of a received image signal based on the updated parameter. Accordingly, it is possible to accurately calculate original quality of an image signal based on learning.

Meanwhile, the display 180 may be implemented with any one of various panels. For example, the display 180 may be any one of a liquid crystal display panel (LCD panel), an organic light emitting diode panel (OLED panel), an inorganic light emitting diode panel (LED panel).

In the present disclosure, an example in which the display 180 includes the organic light emitting diode panel (OLED panel) is mainly described.

Meanwhile, the OLED panel exhibits a faster response speed than the LED and is excellent in color reproduction.

Accordingly, if the display 180 includes an OLED panel, it is preferable that the signal processing device 170 (see FIG. 2) of the image display apparatus 100 performs image quality processing for the OLED panel. Meanwhile, the signal processing device may be called a signal processing device.

Meanwhile, the image display apparatus 100 in FIG. 1 may be a TV, a monitor, a tablet PC, a mobile terminal, a display for a vehicle, etc.

Meanwhile, the image display apparatus 100 may upmix an input audio signal of stereo channel into an audio signal of multichannel using a deep neural network.

To this end, the image display apparatus 100 according to an embodiment of the present disclosure includes a converter 1010 for frequency converting an input stereo audio signal, a primary component analyzer 1030 that performs primary component analysis based on the signal from the converter 1010, a feature extractor 1040 for extracting a feature of the primary component signal based on the signal from the primary component analyzer 1030, an envelope adjustor 1060 for performing envelope adjustment based on prediction performed on the basis of a deep neural network model, and an inverse converter 1070 for inversely converting a signal from the envelope adjustor 1060 to output an upmix audio signal of multichannel. Accordingly, when upmixing a downmix stereo audio signal to a multichannel audio signal, spatial distortion can be improved. In particular, multi-channel signals can be easily synthesized using the primary component analysis method and the deep neural network model.

Figure 2:
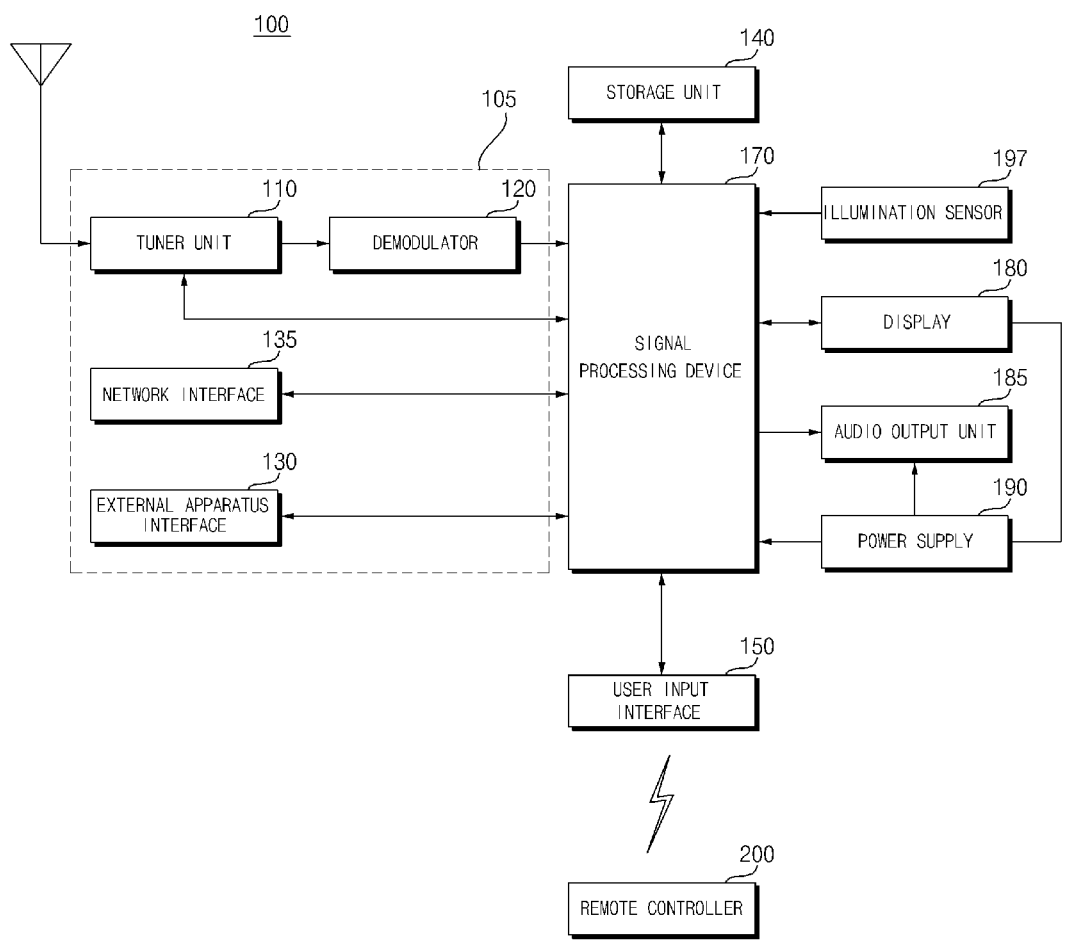
FIG. 2 is an example of an internal block diagram of the image display apparatus of FIG. 1.

FIG. 2 is an example of an internal block diagram of the image display apparatus of FIG. 1.

Referring to FIG. 2, the image display apparatus 100 according to an embodiment of the present disclosure includes a broadcast receiving unit 105, a storage unit 140, a user input interface 150, a sensor unit (not shown), a signal processing device 170, a display 180, an audio output unit 185, and an illumination sensor 197.

The broadcast receiving unit 105 may include a tuner unit 110, a demodulator 120, a network interface 135, and an external apparatus interface 130.

Meanwhile, unlike the drawing, the broadcast receiving unit 105 may include only the tuner unit 110, the demodulator 120, and the external apparatus interface 130. That is, the network interface 135 may not be included.

The tuner unit 110 selects an RF broadcast signal corresponding to a channel selected by a user or all pre-stored channels among radio frequency (RF) broadcast signals received through an antenna (not shown). In addition, the selected RF broadcast signal is converted into an intermediate frequency signal, a baseband image, or an audio signal.

For example, if the selected RF broadcast signal is a digital broadcast signal, it is converted into a digital IF signal (DIF). If the selected RF broadcast signal is an analog broadcast signal, it is converted into an analog baseband image or audio signal (CVBS/SIF). That is, the tuner unit 110 can process a digital broadcast signal or an analog broadcast signal. The analog baseband image or audio signal (CVBS/SIF) output from the tuner unit 110 may be directly input to the signal processing device 170.

Meanwhile, the tuner unit 110 can include a plurality of tuners for receiving broadcast signals of a plurality of channels. Alternatively, a single tuner that simultaneously receives broadcast signals of a plurality of channels is also available.

The demodulator 120 receives the converted digital IF signal DIF from the tuner unit 110 and performs a demodulation operation.

The demodulator 120 may perform demodulation and channel decoding and then output a stream signal TS. At this time, the stream signal may be a multiplexed signal of an image signal, an audio signal, or a data signal.

The stream signal output from the demodulator 120 may be input to the signal processing device 170. The signal processing device 170 performs demultiplexing, image/audio signal processing, and the like, and then outputs an image to the display 180 and outputs audio to the audio output unit 185.

The external apparatus interface 130 may transmit or receive data with a connected external apparatus (not shown), e.g., a set-top box 50. To this end, the external apparatus interface 130 may include an A/V input and output unit (not shown).

The external apparatus interface 130 may be connected in wired or wirelessly to an external apparatus such as a digital versatile disk (DVD), a Blu ray, a game equipment, a camera, a camcorder, a computer (note book), and a set-top box, and may perform an input/output operation with an external apparatus.

The A/V input and output unit may receive image and audio signals from an external apparatus. Meanwhile, a wireless communication unit (not shown) may perform short-range wireless communication with other electronic apparatus.

Through the wireless communication unit (not shown), the external apparatus interface 130 may exchange data with an adjacent mobile terminal 600. In particular, in a mirroring mode, the external apparatus interface 130 may receive device information, executed application information, application image, and the like from the mobile terminal 600.

The network interface 135 provides an interface for connecting the image display apparatus 100 to a wired/wireless network including the Internet network. For example, the network interface 135 may receive, via the network, content or data provided by the Internet, a content provider, or a network operator.

Meanwhile, the network interface 135 may include a wireless communication unit (not shown).

The storage unit 140 may store a program for each signal processing and control in the signal processing device 170, and may store signal-processed image, audio, or data signal.

In addition, the storage unit 140 may serve to temporarily store image, audio, or data signal input to the external apparatus interface 130. In addition, the storage unit 140 may store information on a certain broadcast channel through a channel memory function such as a channel map.

Although FIG. 2 illustrates that the storage unit is provided separately from the signal processing device 170, the scope of the present disclosure is not limited thereto. The storage unit 140 may be included in the signal processing device 170.

The user input interface 150 transmits a signal input by the user to the signal processing device 170 or transmits a signal from the signal processing device 170 to the user.

For example, it may transmit/receive a user input signal such as power on/off, channel selection, screen setting, etc., from a remote controller 200, may transfer a user input signal input from a local key (not shown) such as a power key, a channel key, a volume key, a set value, etc., to the signal processing device 170, may transfer a user input signal input from a sensor unit (not shown) that senses a user's gesture to the signal processing device 170, or may transmit a signal from the signal processing device 170 to the sensor unit (not shown).

The signal processing device 170 may demultiplex the input stream through the tuner unit 110, the demodulator 120, the network interface 135, or the external apparatus interface 130, or process the demultiplexed signals to generate and output a signal for image or audio output.

For example, the signal processing device 170 may receive a broadcast signal or HDMI signal received by the broadcast receiving unit 105, and perform signal processing based on the received broadcast signal or HDMI signal to thereby output a processed image signal.

The image signal processed by the signal processing device 170 is input to the display 180, and may be displayed as an image corresponding to the image signal. In addition, the image signal processed by the signal processing device 170 may be input to the external output apparatus through the external apparatus interface 130.

The audio signal processed by the signal processing device 170 may be output to the audio output unit 185 as an audio signal. In addition, audio signal processed by the signal processing device 170 may be input to the external output apparatus through the external apparatus interface 130.

Although not shown in FIG. 2, the signal processing device 170 may include a demultiplexer, an image processing unit, and the like. That is, the signal processing device 170 is capable of performing a variety of signal processing, and, for this reason, the signal processing device 170 may be implemented in the form of System On Chip (SOC). This will be described later with reference to FIG. 3.

In addition, the signal processing device 170 can control the overall operation of the image display apparatus 100. For example, the signal processing device 170 may control the tuner unit 110 to control the tuning of the RF broadcast corresponding to the channel selected by the user or the previously stored channel.

In addition, the signal processing device 170 may control the image display apparatus 100 according to a user command input through the user input interface 150 or an internal program.

Meanwhile, the signal processing device 170 may control the display 180 to display an image. At this time, the image displayed on the display 180 may be a still image or a moving image, and may be a 2D image or a 3D image.

Meanwhile, the signal processing device 170 may display a certain object in an image displayed on the display 180. For example, the object may be at least one of a connected web screen (newspaper, magazine, etc.), an electronic program guide (EPG), various menus, a widget, an icon, a still image, a moving image, and a text.

Meanwhile, the signal processing device 170 may recognize the position of the user based on the image photographed by a photographing unit (not shown). For example, the distance (z-axis coordinate) between a user and the image display apparatus 100 can be determined. In addition, the x-axis coordinate and the y-axis coordinate in the display 180 corresponding to a user position can be determined.

The display 180 generates a driving signal by converting an image signal, a data signal, an OSD signal, a control signal processed by the signal processing device 170, an image signal, a data signal, a control signal, and the like received from the external apparatus interface 130.

Meanwhile, the display 180 may be configured as a touch screen and used as an input device in addition to an output device.

The audio output unit 185 receives a signal processed by the signal processing device 170 and outputs it as an audio.

The photographing unit (not shown) photographs a user. The photographing unit (not shown) may be implemented by a single camera, but the present disclosure is not limited thereto and may be implemented by a plurality of cameras. Image information photographed by the photographing unit (not shown) may be input to the signal processing device 170.

The signal processing device 170 may sense a gesture of the user based on each of the images photographed by the photographing unit (not shown), the signals detected from the sensor unit (not shown), or a combination thereof.

The power supply 190 supplies corresponding power to the image display apparatus 100. Particularly, the power supply 190 may supply the power to the signal processing device 170 which can be implemented in the form of SOC, the display 180 for displaying an image, and an audio output unit 185 for outputting an audio.

Specifically, the power supply 190 may include a converter for converting an AC power into a DC power, and a DC/DC converter for converting the level of the DC power.

The illumination sensor 197 may sense ambient illumination of the display 180.

The remote controller 200 transmits the user input to the user input interface 150. To this end, the remote controller 200 may use Bluetooth, a radio frequency (RF) communication, an infrared (IR) communication, an Ultra Wideband (UWB), ZigBee, or the like. In addition, the remote controller 200 may receive the image, audio, or data signal output from the user input interface 150, and display it on the remote controller 200 or output it as an audio.

Meanwhile, the image display apparatus 100 may be a fixed or mobile digital broadcasting receiver capable of receiving digital broadcasting.

Meanwhile, a block diagram of the image display apparatus 100 shown in FIG. 2 is a block diagram for an embodiment of the present disclosure. Each component of the block diagram may be integrated, added, or omitted according to a specification of the image display apparatus 100 actually implemented. That is, two or more components may be combined into a single component as needed, or a single component may be divided into two or more components. The function performed in each block is described for the purpose of illustrating embodiments of the present disclosure, and specific operation and apparatus do not limit the scope of the present disclosure.

Figure 3:
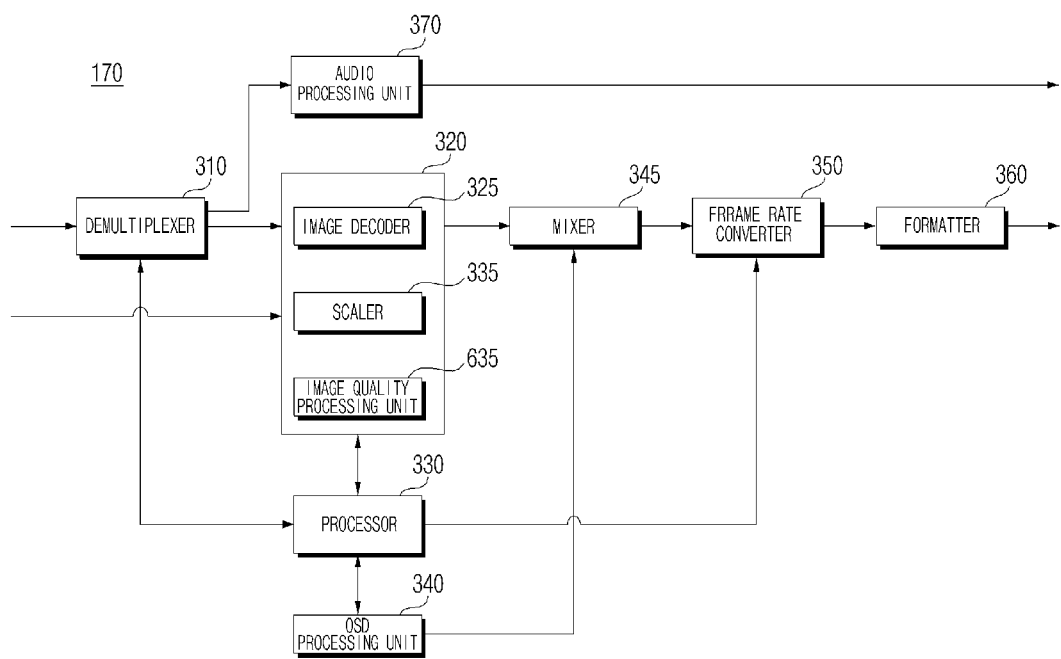
FIG. 3 is an example of an internal block diagram of a signal processing device shown in FIG. 2.

FIG. 3 is an example of an internal block diagram of a signal processing device shown in FIG. 2.

Referring to the drawing, the signal processing device 170 according to an embodiment of the present disclosure may include a demultiplexer 310, an image processing unit 320, a processor 330, and an audio processing unit 370. In addition, it may further include a data processing unit (not shown).

The demultiplexer 310 demultiplexes the input stream. For example, when an MPEG-2 TS is input, it can be demultiplexed into image, audio, and data signal, respectively. Here, the stream signal input to the demultiplexer 310 may be a stream signal output from the tuner unit 110, the demodulator 120, or the external apparatus interface 130.

The image processing unit 320 may perform signal processing on an input image. For example, the image processing unit 320 may perform image processing on an image signal demultiplexed by the demultiplexer 310.

To this end, the image processing unit 320 may include an image decoder 325, a scaler 335, an image quality processing unit 635, an image encoder (not shown), an OSD processing unit 340, a frame rate converter 350, a formatter 360, etc.

The image decoder 325 decodes a demultiplexed image signal, and the scaler 335 performs scaling so that the resolution of the decoded image signal can be output from the display 180.

The image decoder 325 can include a decoder of various standards. For example, a 3D image decoder for MPEG-2, H.264 decoder, a color image, and a depth image, and a decoder for a multiple view image may be provided.

The scaler 335 may scale an input image signal decoded by the image decoder 325 or the like.

For example, if the size or resolution of an input image signal is small, the scaler 335 may upscale the input image signal, and, if the size or resolution of the input image signal is great, the scaler 335 may downscale the input image signal.

The image quality processing unit 635 may perform image quality processing on an input image signal decoded by the image decoder 325 or the like.

For example, the image quality processing unit 625 may perform noise reduction processing on an input image signal, extend a resolution of gray level of the input image signal, perform image resolution enhancement, perform high dynamic range (HDR)-based signal processing, change a frame rate, perform image quality processing appropriate for properties of a panel, especially an OLED panel, etc.

The OSD processing unit 340 generates an OSD signal according to a user input or by itself. For example, based on a user input signal, the OSD processing unit 340 may generate a signal for displaying various information as a graphic or a text on the screen of the display 180. The generated OSD signal may include various data such as a user interface screen of the image display apparatus 100, various menu screens, a widget, and an icon. In addition, the generated OSD signal may include a 2D object or a 3D object.

In addition, the OSD processing unit 340 may generate a pointer that can be displayed on the display, based on a pointing signal input from the remote controller 200. In particular, such a pointer may be generated by a pointing signal processing device, and the OSD processing unit 340 may include such a pointing signal processing device (not shown). Obviously, the pointing signal processing device (not shown) may be provided separately from the OSD processing unit 340.

The frame rate converter (FRC) 350 may convert the frame rate of an input image. Meanwhile, the frame rate converter 350 can also directly output the frame rate without any additional frame rate conversion.

Meanwhile, the formatter 360 may change a format of an input image signal into a format suitable for displaying the image signal on a display and output the image signal in the changed format.

In particular, the formatter 360 may change a format of an image signal to correspond to a display panel.

The processor 330 may control overall operations of the image display apparatus 100 or the signal processing device 170.

For example, the processor 330 may control the tuner unit 110 to control the tuning of an RF broadcast corresponding to a channel selected by a user or a previously stored channel.

In addition, the processor 330 may control the image display apparatus 100 according to a user command input through the user input interface 150 or an internal program.

In addition, the processor 330 may transmit data to the network interface unit 135 or to the external apparatus interface 130

In addition, the processor 330 may control the demultiplexer 310, the image processing unit 320, and the like in the signal processing device 170.

Meanwhile, the audio processing unit 370 in the signal processing device 170 may perform the audio processing of the demultiplexed audio signal. To this end, the audio processing unit 370 may include various decoders.

In addition, the audio processing unit 370 in the signal processing device 170 may process a base, a treble, a volume control, and the like.

The data processing unit (not shown) in the signal processing device 170 may perform data processing of the demultiplexed data signal. For example, when the demultiplexed data signal is a coded data signal, it can be decoded. The encoded data signal may be electronic program guide information including broadcast information such as a start time and an end time of a broadcast program broadcasted on each channel.

Meanwhile, a block diagram of the signal processing device 170 shown in FIG. 3 is a block diagram for an embodiment of the present disclosure. Each component of the block diagram may be integrated, added, or omitted according to a specification of the signal processing device 170 actually implemented.

In particular, the frame rate converter 350 and the formatter 360 may be provided separately from the image processing unit 320.

Figure 4A:
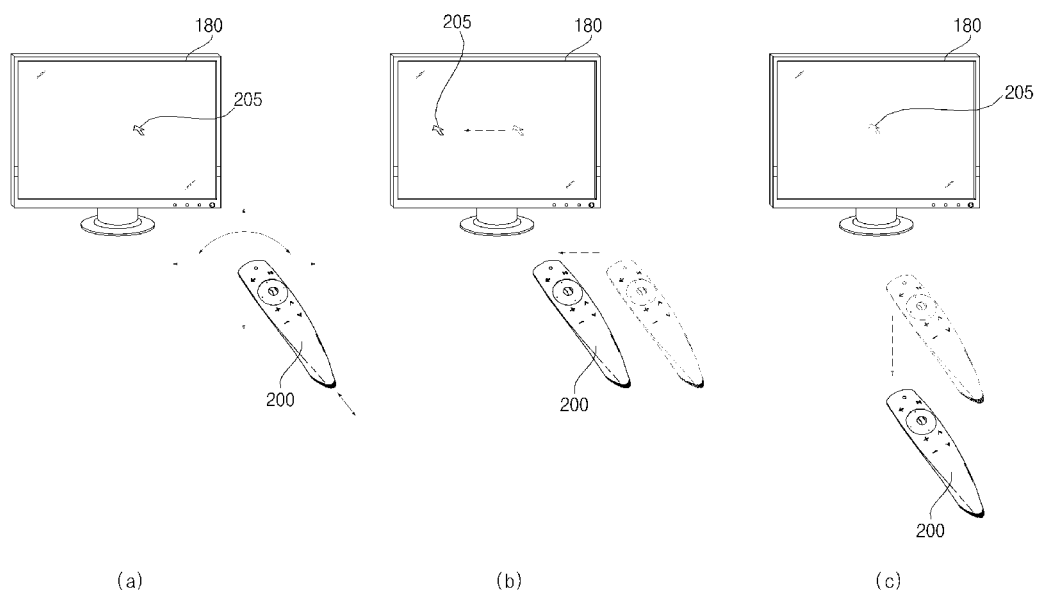
FIG. 4A is a diagram illustrating a control method of a remote controller of FIG. 2.

FIG. 4A is a diagram illustrating a control method of a remote controller of FIG. 2.

As shown in FIG. 4A(a), it is illustrated that a pointer 205 corresponding to the remote controller 200 is displayed on the display 180.

The user may move or rotate the remote controller 200 up and down, left and right (FIG. 4A(b)), and back and forth (FIG. 4A(c)). The pointer 205 displayed on the display 180 of the image display apparatus corresponds to the motion of the remote controller 200. Such a remote controller 200 may be referred to as a space remote controller or a 3D pointing apparatus, because the pointer 205 is moved and displayed according to the movement in a 3D space, as shown in the drawing.

FIG. 4A(b) illustrates that when the user moves the remote controller 200 to the left, the pointer 205 displayed on the display 180 of the image display apparatus also moves to the left correspondingly.

Information on the motion of the remote controller 200 detected through a sensor of the remote controller 200 is transmitted to the image display apparatus. The image display apparatus may calculate the coordinate of the pointer 205 from the information on the motion of the remote controller 200. The image display apparatus may display the pointer 205 to correspond to the calculated coordinate.

FIG. 4A(c) illustrates a case where the user moves the remote controller 200 away from the display 180 while pressing a specific button of the remote controller 200. Thus, a selection area within the display 180 corresponding to the pointer 205 may be zoomed in so that it can be displayed to be enlarged. On the other hand, when the user moves the remote controller 200 close to the display 180, the selection area within the display 180 corresponding to the pointer 205 may be zoomed out so that it can be displayed to be reduced. Meanwhile, when the remote controller 200 moves away from the display 180, the selection area may be zoomed out, and when the remote controller 200 approaches the display 180, the selection area may be zoomed in.

Meanwhile, when the specific button of the remote controller 200 is pressed, it is possible to exclude the recognition of vertical and lateral movement. That is, when the remote controller 200 moves away from or approaches the display 180, the up, down, left, and right movements are not recognized, and only the forward and backward movements are recognized. Only the pointer 205 is moved according to the up, down, left, and right movements of the remote controller 200 in a state where the specific button of the remote controller 200 is not pressed.

Meanwhile, the moving speed or the moving direction of the pointer 205 may correspond to the moving speed or the moving direction of the remote controller 200.

Figure 4B:
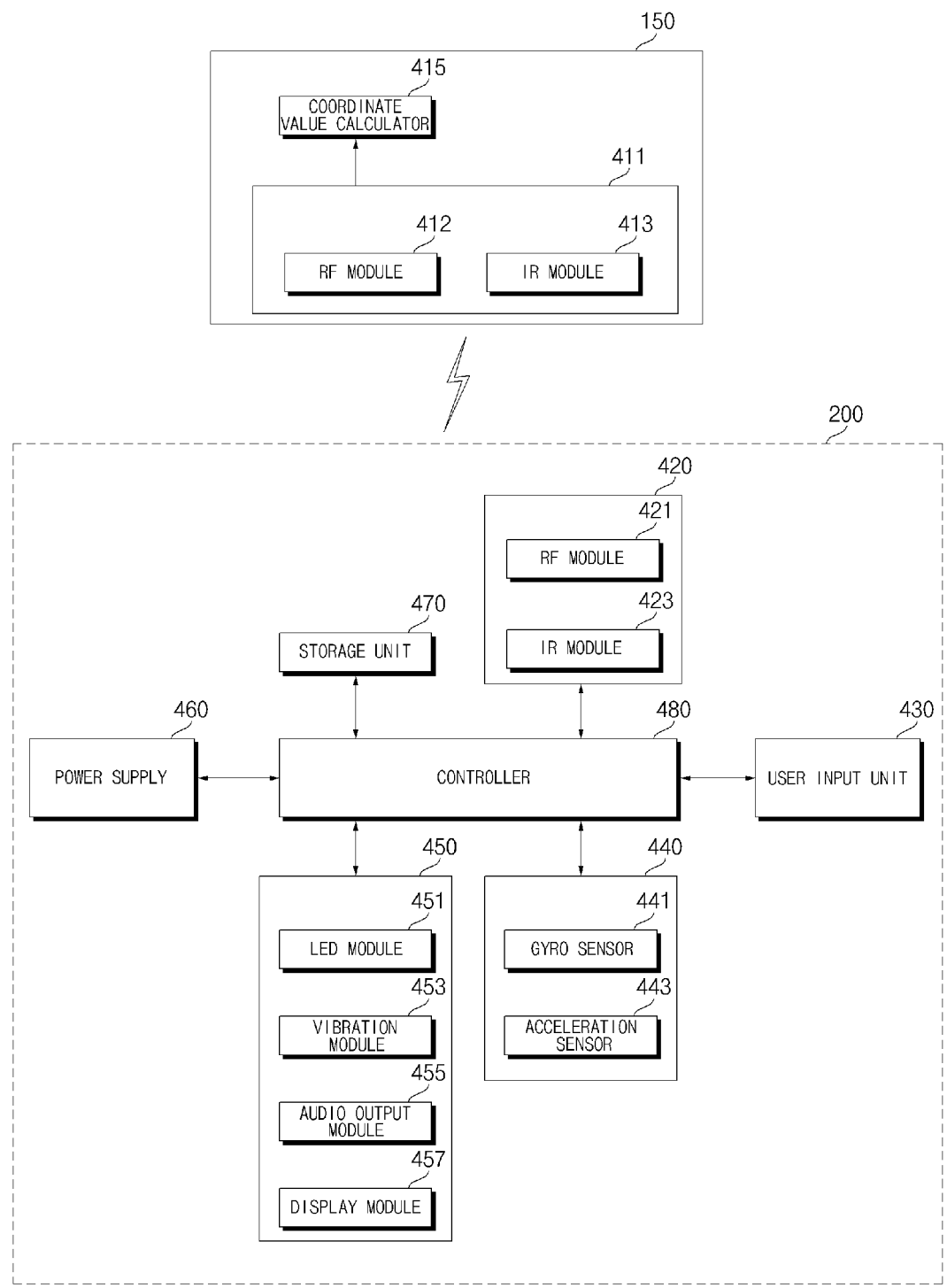
FIG. 4B is an internal block diagram of the remote controller of FIG. 2.

FIG. 4B is an internal block diagram of the remote controller of FIG. 2.

Referring to the drawing, the remote controller 200 includes a wireless communication unit 425, a user input unit 430, a sensor unit 440, an output unit 450, a power supply 460, a storage unit 470, and a controller 480.

The wireless communication unit 425 transmits/receives a signal to/from any one of the image display apparatuses according to the embodiments of the present disclosure described above. Among the image display apparatuses according to the embodiments of the present disclosure, one image display apparatus 100 will be described as an example.

In the present embodiment, the remote controller 200 may include an RF module 421 for transmitting and receiving signals to and from the image display apparatus 100 according to a RF communication standard. In addition, the remote controller 200 may include an IR module 423 for transmitting and receiving signals to and from the image display apparatus 100 according to a IR communication standard.

In the present embodiment, the remote controller 200 transmits a signal containing information on the motion of the remote controller 200 to the image display apparatus 100 through the RF module 421.

In addition, the remote controller 200 may receive the signal transmitted by the image display apparatus 100 through the RF module 421. In addition, if necessary, the remote controller 200 may transmit a command related to power on/off, channel change, volume change, and the like to the image display apparatus 100 through the IR module 423.

The user input unit 435 may be implemented by a keypad, a button, a touch pad, a touch screen, or the like. The user may operate the user input unit 435 to input a command related to the image display apparatus 100 to the remote controller 200. When the user input unit 435 includes a hard key button, the user can input a command related to the image display apparatus 100 to the remote controller 200 through a push operation of the hard key button. When the user input unit 435 includes a touch screen, the user may touch a soft key of the touch screen to input the command related to the image display apparatus 100 to the remote controller 200. In addition, the user input unit 435 may include various types of input means such as a scroll key, a jog key, etc., which can be operated by the user, and the present disclosure does not limit the scope of the present disclosure.

The sensor unit 440 may include a gyro sensor 441 or an acceleration sensor 443. The gyro sensor 441 may sense information about the motion of the remote controller 200.

For example, the gyro sensor 441 may sense information on the operation of the remote controller 200 based on the x, y, and z axes. The acceleration sensor 443 may sense information on the moving speed of the remote controller 200. Meanwhile, a distance measuring sensor may be further provided, and thus, the distance to the display 180 may be sensed.

The output unit 450 may output an image or an audio signal corresponding to the operation of the user input unit 435 or a signal transmitted from the image display apparatus 100. Through the output unit 450, the user may recognize whether the user input unit 435 is operated or whether the image display apparatus 100 is controlled.

For example, the output unit 450 may include an LED module 451 that is turned on when the user input unit 430 is operated or a signal is transmitted/received to/from the image display apparatus 100 through the wireless communication unit 425, a vibration module 453 for generating a vibration, an audio output module 455 for outputting an audio, or a display module 457 for outputting an image.

The power supply 460 supplies power to the remote controller 200. When the remote controller 200 is not moved for a certain time, the power supply 460 may stop the supply of power to reduce a power waste. The power supply 460 may resume power supply when a certain key provided in the remote controller 200 is operated.

The storage unit 470 may store various types of programs, application data, and the like necessary for the control or operation of the remote controller 200. If the remote controller 200 wirelessly transmits and receives a signal to/from the image display apparatus 100 through the RF module 421, the remote controller 200 and the image display apparatus 100 transmit and receive a signal through a certain frequency band. The controller 480 of the remote controller 200 may store information about a frequency band or the like for wirelessly transmitting and receiving a signal to/from the image display apparatus 100 paired with the remote controller 200 in the storage unit 470 and may refer to the stored information.

The controller 480 controls various matters related to the control of the remote controller 200. The controller 480 may transmit a signal corresponding to a certain key operation of the user input unit 430 or a signal corresponding to the motion of the remote controller 200 sensed by the sensor unit 440 to the image display apparatus 100 through the wireless communication unit 425.

The user input interface 150 of the image display apparatus 100 includes a wireless communication unit 151 that can wirelessly transmit and receive a signal to and from the remote controller 200 and a coordinate value calculator 415 that can calculate the coordinate value of a pointer corresponding to the operation of the remote controller 200.

The user input interface 150 may wirelessly transmit and receive a signal to and from the remote controller 200 through the RF module 412. In addition, the user input interface 150 may receive a signal transmitted by the remote controller 200 through the IR module 413 according to a IR communication standard.

The coordinate value calculator 415 may correct a hand shake or an error from a signal corresponding to the operation of the remote controller 200 received through the wireless communication unit 151 and calculate the coordinate value (x, y) of the pointer 205 to be displayed on the display 180.

The transmission signal of the remote controller 200 inputted to the image display apparatus 100 through the user input interface 150 is transmitted to the signal processing device 170 of the image display apparatus 100. The signal processing device 170 may determine the information on the operation of the remote controller 200 and the key operation from the signal transmitted from the remote controller 200, and, correspondingly, control the image display apparatus 100.

For another example, the remote controller 200 may calculate the pointer coordinate value corresponding to the operation and output it to the user input interface 150 of the image display apparatus 100. In this case, the user input interface 150 of the image display apparatus 100 may transmit information on the received pointer coordinate value to the signal processing device 170 without a separate correction process of hand shake or error.

For another example, unlike the drawing, the coordinate value calculator 415 may be provided in the signal processing device 170, not in the user input interface 150.

Figure 5:
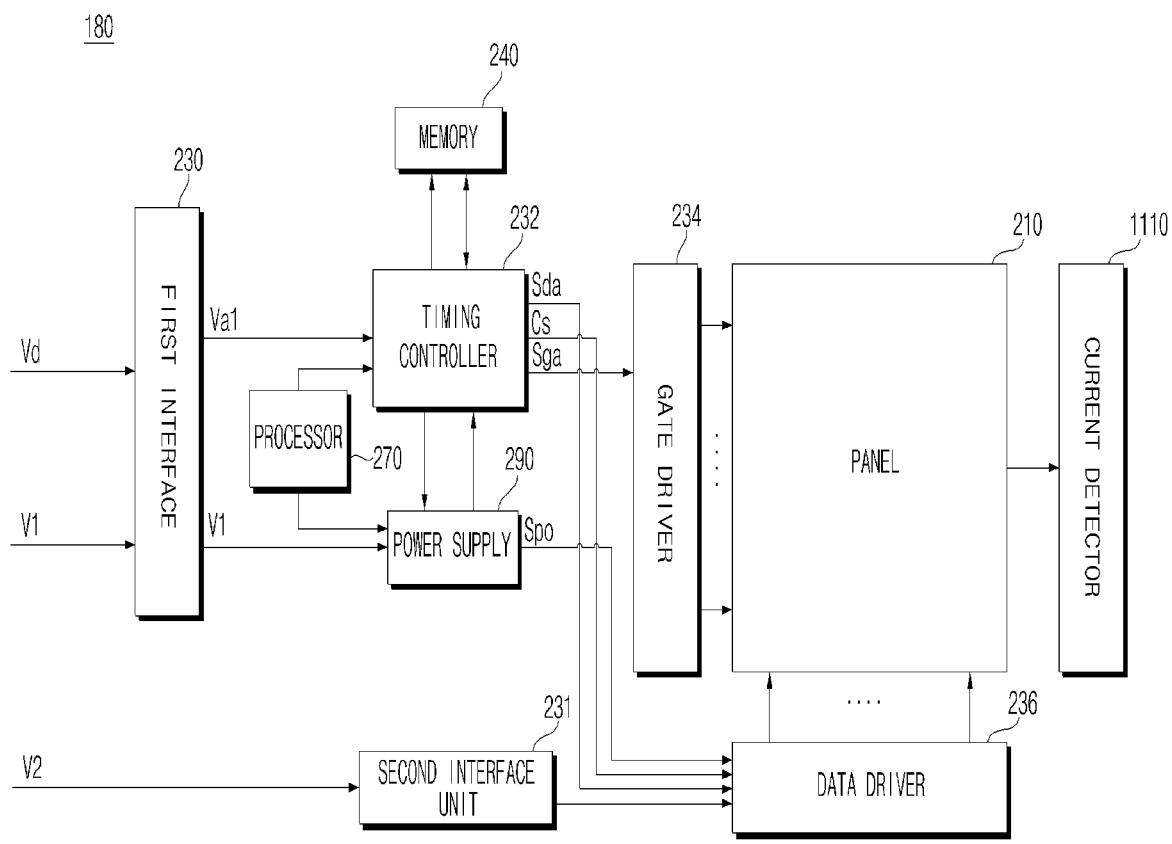
FIG. 5 is an internal block diagram of a display of FIG. 2.

FIG. 5 is an internal block diagram of a display of FIG. 2.

Referring to FIG. 5, the organic light emitting diode panel-based display 180 may include an organic light emitting diode panel 210, a first interface 230, a second interface 231, a timing controller 232, a gate driver 234, a data driver 236, a memory 240, a processor 270, a power supply 290, a current detector 510, and the like.

The display 180 receives an image signal Vd, a first DC power V1, and a second DC power V2, and may display a certain image based on the image signal Vd.

Meanwhile, the first interface 230 in the display 180 may receive the image signal Vd and the first DC power V1 from the signal processing device 170.

Here, the first DC power V1 may be used for the operation of the power supply 290 and the timing controller 232 in the display 180.

Next, the second interface 231 may receive a second DC power V2 from an external power supply 190. Meanwhile, the second DC power V2 may be input to the data driver 236 in the display 180.

The timing controller 232 may output a data driving signal Sda and a gate driving signal Sga, based on the image signal Vd.

For example, when the first interface 230 converts the input image signal Vd and outputs the converted image signal val, the timing controller 232 may output the data driving signal Sda and the gate driving signal Sga based on the converted image signal val.

The timing controller 232 may further receive a control signal, a vertical synchronization signal Vsync, and the like, in addition to the image signal Vd from the signal processing device 170.

In addition to the image signal Vd, based on a control signal, a vertical synchronization signal Vsync, and the like, the timing controller 232 generates a gate driving signal Sga for the operation of the gate driver 234, and a data driving signal Sda for the operation of the data driver 236.

At this time, when the panel 210 includes a RGBW subpixel, the data driving signal Sda may be a data driving signal for driving of RGBW subpixel.

Meanwhile, the timing controller 232 may further output a control signal Cs to the gate driver 234.

The gate driver 234 and the data driver 236 supply a scan signal and an image signal to the organic light emitting diode panel 210 through a gate line GL and a data line DL respectively, according to the gate driving signal Sga and the data driving signal Sda from the timing controller 232. Accordingly, the organic light emitting diode panel 210 displays a certain image.

Meanwhile, the organic light emitting diode panel 210 may include an organic light emitting layer. In order to display an image, a plurality of gate lines GL and data lines DL may be disposed in a matrix form in each pixel corresponding to the organic light emitting layer.

Meanwhile, the data driver 236 may output a data signal to the organic light emitting diode panel 210 based on a second DC power V2 from the second interface 231.

The power supply 290 may supply various power supplies to the gate driver 234, the data driver 236, the timing controller 232, and the like.

The current detector 510 may detect the current flowing in a sub-pixel of the organic light emitting diode panel 210. The detected current may be input to the processor 270 or the like, for a cumulative current calculation.

The processor 270 may perform each type of control of the display 180. For example, the processor 270 may control the gate driver 234, the data driver 236, the timing controller 232, and the like.

Meanwhile, the processor 270 may receive current information flowing in a sub-pixel of the organic light emitting diode panel 210 from the current detector 510.

In addition, the processor 270 may calculate the accumulated current of each subpixel of the organic light emitting diode panel 210, based on information of current flowing through the subpixel of the organic light emitting diode panel 210. The calculated accumulated current may be stored in the memory 240.

Meanwhile, the processor 270 may determine as burn-in, if the accumulated current of each sub-pixel of the organic light emitting diode panel 210 is equal to or greater than an allowable value.

For example, if the accumulated current of each subpixel of the OLED panel 210 is equal to or higher than 300000 A, the processor 270 may determine that a corresponding subpixel is a burn-in subpixel.

Meanwhile, if the accumulated current of each subpixel of the OLED panel 210 is close to an allowable value, the processor 270 may determine that a corresponding subpixel is a subpixel expected to be burn in.

Meanwhile, based on a current detected by the current detector 510, the processor 270 may determine that a subpixel having the greatest accumulated current is an expected burn-in subpixel.

Figure 6A:
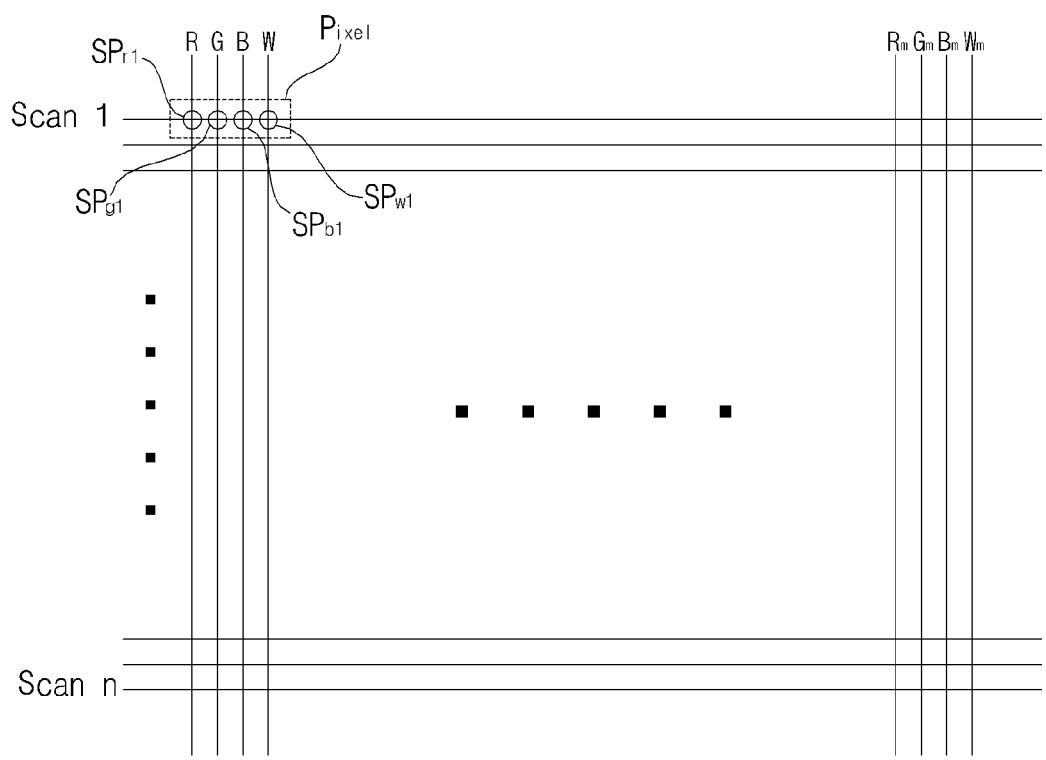
FIG. 6A and FIG. 6B are diagrams referred to in the description of an organic light emitting diode panel of FIG. 5.
Figure 6B:
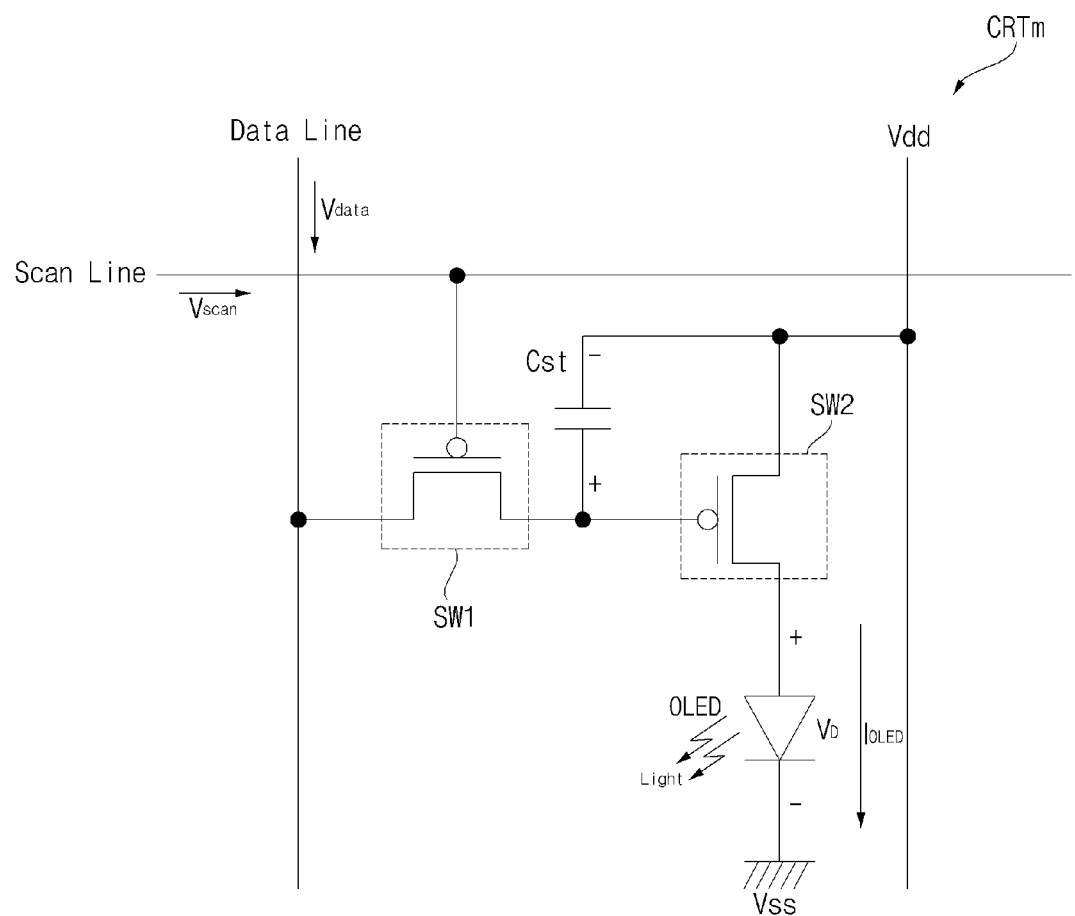

FIG. 6A and FIG. 6B are diagrams referred to in the description of an organic light emitting diode panel of FIG. 5.

Firstly, FIG. 6A is a diagram illustrating a pixel in the organic light emitting diode panel 210.

Referring to drawing, the organic light emitting diode panel 210 may include a plurality of scan lines $Scan_1$ to $Scan_n$ and a plurality of data lines R1, G1, B1, W1 to $R_m$, $G_m$, $B_m$, $W_m$ intersecting the scan lines.

Meanwhile, a pixel (subpixel) is defined in an intersecting area of the scan line and the data line in the organic light emitting diode panel 210. In the drawing, a pixel including sub-pixels SR1, SG1, SB1 and SW1 of RGBW is shown.

FIG. 6B illustrates a circuit of any one sub-pixel in the pixel of the organic light emitting diode panel of FIG. 6A.

Referring to drawing, an organic light emitting sub pixel circuit (CRTm) may include, as an active type, a scan switching element SW1, a storage capacitor Cst, a drive switching element SW2, and an organic light emitting layer (OLED).

The scan switching element SW1 is turned on according to the input scan signal Vdscan, as a scan line is connected to a gate terminal. When it is turned on, the input data signal Vdata is transferred to the gate terminal of a drive switching element SW2 or one end of the storage capacitor Cst.

The storage capacitor Cst is formed between the gate terminal and the source terminal of the drive switching element SW2, and stores a certain difference between a data signal level transmitted to one end of the storage capacitor Cst and a DC power (VDD) level transmitted to the other terminal of the storage capacitor Cst.

For example, when the data signal has a different level according to a Plume Amplitude Modulation (PAM) method, the power level stored in the storage capacitor Cst varies according to the level difference of the data signal Vdata.

For another example, when the data signal has a different pulse width according to a Pulse Width Modulation (PWM) method, the power level stored in the storage capacitor Cst varies according to the pulse width difference of the data signal Vdata.

The drive switching element SW2 is turned on according to the power level stored in the storage capacitor Cst. When the drive switching element SW2 is turned on, the driving current (IOLED), which is proportional to the stored power level, flows in the organic light emitting layer (OLED). Accordingly, the organic light emitting layer OLED performs a light emitting operation.

The organic light emitting layer OLED may include a light emitting layer (EML) of RGBW corresponding to a subpixel, and may include at least one of a hole injecting layer (HIL), a hole transporting layer (HTL), an electron transporting layer (ETL), and an electron injecting layer (EIL). In addition, it may include a hole blocking layer, and the like.

Meanwhile, all the subpixels emit a white light in the organic light emitting layer OLED. However, in the case of green, red, and blue subpixels, a subpixel is provided with a separate color filter for color implementation. That is, in the case of green, red, and blue subpixels, each of the subpixels further includes green, red, and blue color filters. Meanwhile, since a white subpixel outputs a white light, a separate color filter is not required.

Meanwhile, in the drawing, it is illustrated that a p-type MOSFET is used for a scan switching element SW1 and a drive switching element SW2, but an n-type MOSFET or other switching element such as a JFET, IGBT, SIC, or the like are also available.

Meanwhile, the pixel is a hold-type element that continuously emits light in the organic light emitting layer (OLED), after a scan signal is applied, during a unit display period, specifically, during a unit frame.

Figure 7:
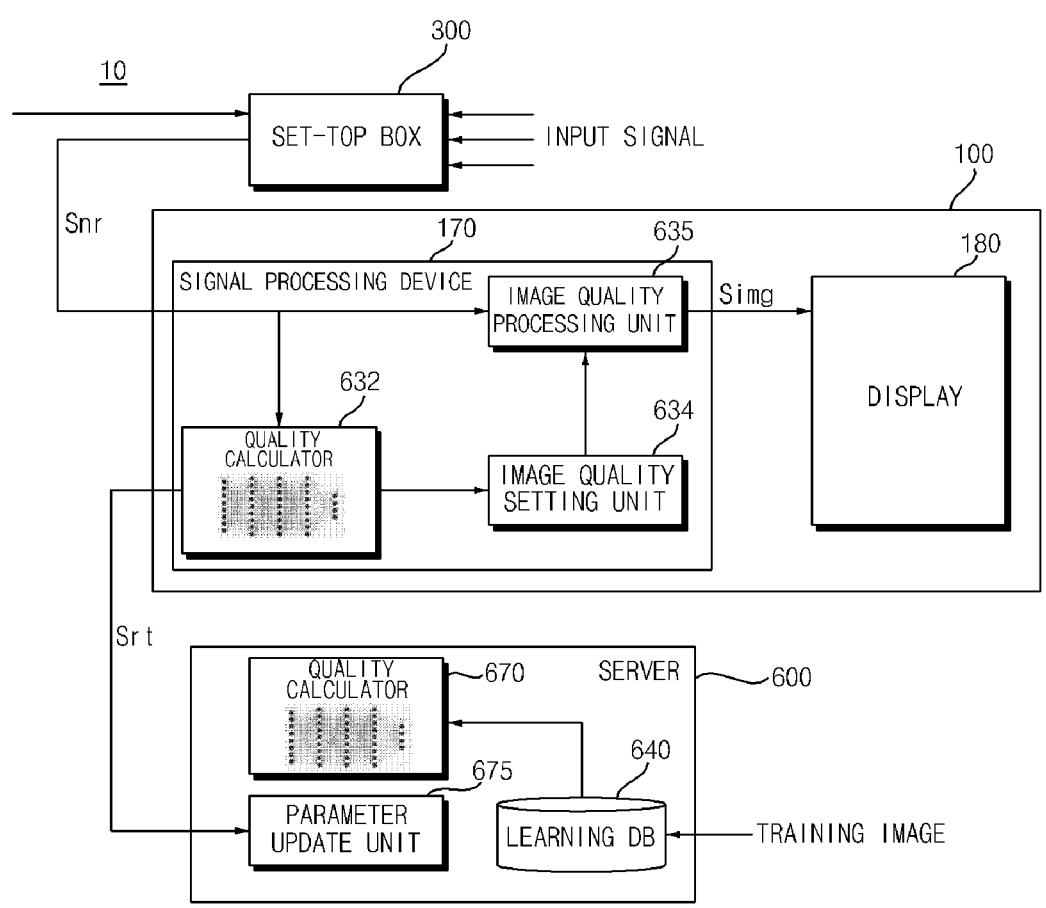
FIG. 7 is an example of an internal block diagram of a signal processing device according to an embodiment of the present disclosure.
Figure 8:
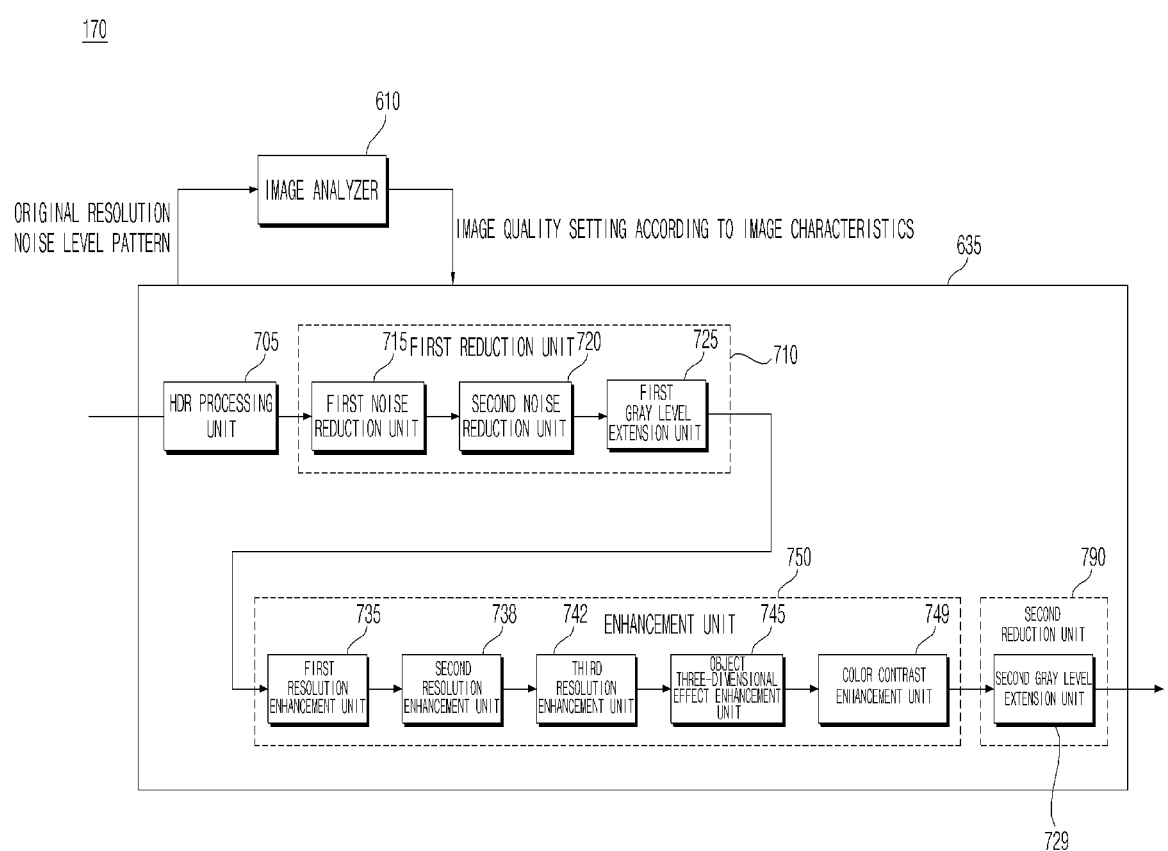
FIGS. 8 to 9B are diagrams referred to in the description of the signal processing device shown in FIG. 7.
Figure 9A:
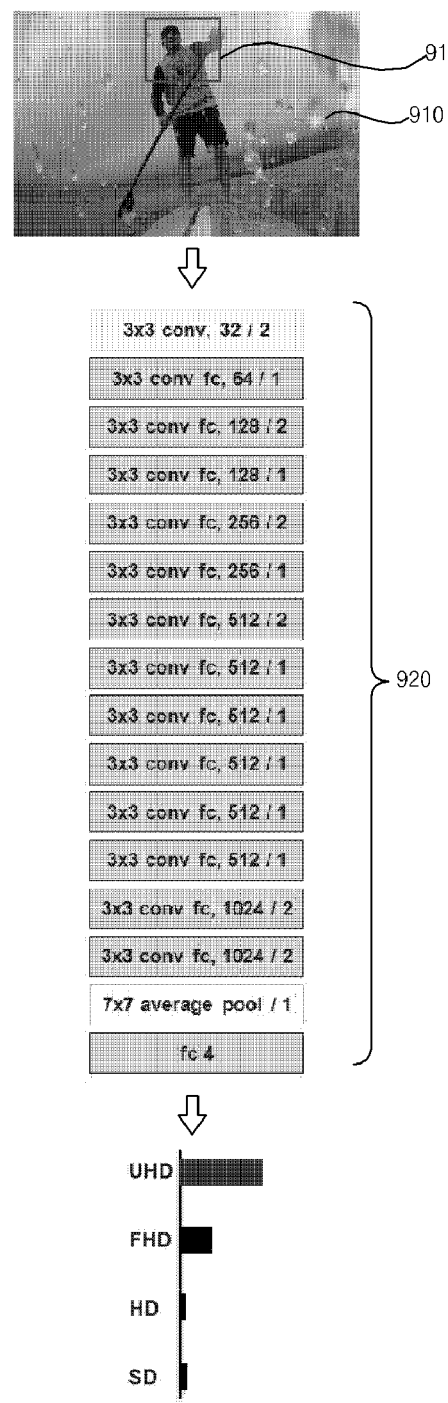
Figure 9B:

FIG. 7 is an example of an internal block diagram of a signal processing device according to an embodiment of the present disclosure, and FIGS. 8 to 9B are diagrams referred to in the description of the signal processing device shown in FIG. 7.

First, referring to FIG. 7, an image display system 10 according to an embodiment of the present disclosure may include an image display apparatus 100, a server 600, and a set-top box 300.

The server 600 may include a learning DB 640 configured to receive a training image and store the received training image; a quality calculator 670 configured to calculate an image source quality using the training image retrieved from the learning DB 6400 and a Deep Neural Network (DNN); and a parameter update unit 675 configured to update a parameter for the DNN based on the learning DB 640 and the quality calculator 670.

The parameter update unit 675 may transmit the updated parameter to a quality calculator 632 of the image display apparatus 100.

The set-top box 300 may receive an input signal from an image provider, and transmit the image signal to an HDMI terminal of the image display apparatus 100.

The image display 100 may include: an image receiver 105 configured to receive an image signal via an external set-top box 300 or a network; a signal processing device 170 configured to perform signal processing on the image signal received by the image receiving unit 105; and a display 180 configured to display an image processed by the signal processing device 170.

Meanwhile, the image display apparatus 100 may apply an optimal tuning for the quality of an input image.

Meanwhile, the image display apparatus 100 may analyze an input image in real time to determine an original resolution, a noise level, a compression level, and an enhancement level of the input image.

Meanwhile, the image display apparatus 100 may change an image quality setting based on calculated image information data without causing a sense of discomfort or distortion.

Meanwhile, the signal processing device 170 may include: the quality calculator 632 configured to calculate original quality of an image signal received via the external set-top box 300 or a network; an image quality setting unit 634 configured to set the quality of the image signal; and an image quality processing unit 635 configured to perform image quality processing on the image signal according to the set quality.

If original quality of an input image signal is changed at a first point in time, the image quality setting unit 634 changes an image quality setting from a first setting to a second setting in a sequence and the image quality processing unit 634 may perform image quality processing according to the sequential change of the first setting to the second setting. Accordingly, it is possible to reduce flicker when the image quality is changed due to the change of the original quality of the input image signal. In particular, when the original quality of the image signal is changed, the quality may be changed smoothly rather than radically.

Meanwhile, if original quality of a received image signal is modified at a first point in time while an image is reproduced, the image quality setting unit 634 may sequentially change an image quality setting from a first setting to a second setting. Accordingly, when changing the original quality of the received image signal, it is possible to change the image quality setting in real time. In particular, when the original quality of the image signal is changed, the image quality may be changed smoothly rather than radically.

Meanwhile, if original quality of a received image signal is changed at a first point in time due to a channel change or an input change while the image signal is received from the set-top box 300, the image quality setting unit 634 change the image quality from a first setting to a second setting in a sequence. Accordingly, it is possible to reduce flicker when the image quality is changed due to the original quality of the received image signal is changed. In particular, when the original quality of the image signal is changed, the image quality may be changed smoothly rather than radically.

The quality calculator 632 may classify an input image as an UHD (3840×2160 or more), HD (1280×720), or SD (720×480 or more) image.

The quality calculator 632 may calculate a probability for each resolution with respect to an input image, select a resolution having the highest probability as the final resolution and exclude a resolution having a too low probability.

The quality calculator 632 may anticipate a noise level and a compression level in addition to the resolution.

Meanwhile, when calculating the compression level, the quality calculator 632 may determine the compression level based on training data obtained by reducing a compression bit-rate with reference to an original state.

For example, for FHD, the quality calculator 632 may evaluate the current digital TV broadcasting standard as 1.0 and calculate such that the value can be reduced to 0.0 when data be lost as compressed too much.

Meanwhile, the quality calculator 632 may calculate a noise level by measuring a level of flicker in an input image.

For example, the quality calculator 632 may calculate a level of noise in an input image into one of four levels that are high level, medium level, low level, and no-noise level.

Meanwhile, the quality calculator 632 may calculate a resolution and a noise level of a received image signal using a DNN. Accordingly, it is possible to accurately analyze an input image.

Meanwhile, the quality calculator 632 may update a parameter for the DNN from the server 600, and calculate a resolution and a noise level of a received image signal based on the updated parameter. Accordingly, it is possible to accurately calculate original quality of an image signal based on learning.

Meanwhile, the quality calculator 632 may extract a first region and a second region from the image signal, and calculate an original resolution of the image signal based on the first region and a noise level of the image signal based on the second region. Accordingly, it is possible to accurately calculate the original quality of the image signal based on extraction of a region suitable for the quality calculation.

Meanwhile, the quality calculator 632 may extract a region having the most edge components in the image signal as a first region, and extract a region having the least edge components in the image signal as a second region. Accordingly, it is possible to accurately calculate the original quality of the image signal based on extraction of a region suitable for the quality calculation.

Meanwhile, the image quality processing unit 635 may increase the noise reduction processing intensity for an image signal as the calculated noise level increases. Accordingly, it is possible to perform image quality processing appropriate for a noise level of a received image signal.

Meanwhile, the quality calculator 632 may calculate an original resolution, a noise level, and a compression level of a received image signal, and calculate the compression level based on training data obtained by reducing a compression bit rate.

Meanwhile, the image quality processing unit 635 may decrease the enhancement intensity for the image signal as the calculated compression level increases. Accordingly, it is possible to accurately calculate the compression level.

Meanwhile, the image quality processing unit 635 may increase the enhancement intensity for the image signal as the original resolution of the image signal increases. Accordingly, it is possible to perform image quality processing appropriate for the original resolution of the received image signal.

Meanwhile, the image quality processing unit 635 may increase the blurring processing intensity for the image signal as the calculated compression level increases. Accordingly, it is possible to perform image quality processing appropriate for a compression level of a received image signal.

Meanwhile, the image quality processing unit 635 may decrease the filter used to filter the image signal as the original resolution of the image signal increases. Accordingly, it is possible to perform image quality processing appropriate for the original resolution of the received image signal.

Meanwhile, the image quality processing unit 635 may downscale an image signal according to an original resolution of an image signal, perform image quality processing on the downscaled image signal, upscales the image-quality-processed image signal, and output the upscaled image signal. Accordingly, it is possible to perform image quality processing appropriate for the original resolution of the received image signal.

FIG. 8 is an example of an internal block diagram of the signal processing device 170 in FIG. 7.

Meanwhile, the signal processing device 170 in FIG. 8 may correspond to the signal processing device 170 in FIG. 2.

First, referring to FIG. 8, the signal processing device 170 according to an embodiment of the present disclosure may include an image analyzer 610 and an image processing unit 635.

The image analyzer 610 may include the quality calculator 632 shown in FIG. 7 and an image quality setting unit 634.

The image analyzer 610 may analyze an input image signal, and output information related to the analyzed input image signal.

Meanwhile, the image analyzer 610 may differentiate an object region and a background region of a first input image signal. Alternatively, the image analyzer 610 may calculate a probability or percentage of the object region and the background region of the first input image signal.

The input image signal may be an input image signal from an image receiving unit 105 or an image decoded by the image decoder 320 in FIG. 3.

In particular, the image analyzer 610 may analyze an input image signal using artificial intelligence (AI), and output information on the analyzed input image signal.

Specifically, the image analyzer 610 may output a resolution, gray level, a noise level, and a pattern of an input image signal, and output information on the analyzed input image signal, especially image setting information, to the image quality processing unit 635.

The image quality processing unit 635 may include an HDR processing unit 705, a first reduction unit 710, an enhancement unit 750, and a second reduction unit 790.

The HDR processing unit 705 may receive an image signal and perform high dynamic range (HDR) processing on the input image signal.

For example, the HDR processing unit 705 may convert a standard dynamic range (SDR) image signal into an HDR image signal.

For another example, the HDR processing unit 705 may receive an image signal, and perform gray level processing on the input image signal for an HDR.

Meanwhile, if an input image signal is an SDR image signal, the HDR processing unit 705 may bypass gray level conversion, and, if an input image signal is an HDR image signal, the HDR processing unit 705 perform gray level conversion. Accordingly, it is possible to improve high gray level expression for an input image.

Meanwhile, the HDR processing unit 705 may convert gray level according to a first gray level conversion mode, in which low gray level is to be enhanced and high gray level is to be saturated, and a second gray level conversion mode, in which low gray level and high gray level are somewhat uniformly converted.

Specifically, if the first gray level conversion mode is implemented, the HDR processing unit 705 may convert gray level based on data corresponding to the first gray level conversion mode in a lookup table.

More specifically, if the first gray level conversion mode is implemented, the HDR processing unit 705 may convert gray level based on an equation of input data and the first gray level conversion mode in a lookup table determined by the equation. Here, the input data may include video data and metadata.

Meanwhile, if the second gray level conversion mode is implemented, the HDR processing unit 705 may convert gray level based on data corresponding to the second gray level conversion mode in a lookup table.

More specifically, if the second gray level conversion mode is implemented, the HDR processing unit 705 may convert gray level based on an equation of input data and data corresponding to the second gray level conversion mode in a lookup table determined by the equation. Here, the input data may include video data and metadata.

Meanwhile, the HDR processing unit 705 may select the first gray level conversion mode or the second gray level conversion mode according to a third gray level conversion mode or a fourth gray level conversion mode in a high gray level amplifying unit 851 in the second reduction unit 790.

For example, if the third gray level conversion mode is implemented, the high gray level amplifying unit 851 in the second reduction unit 790 may convert gray level based on data corresponding to the third gray level conversion mode in a lookup table.

Specifically, if the third gray level conversion mode is implemented, the high gray level amplifying unit 851 in the second reduction unit 790 may perform convert gray level based on an equation of input data and data corresponding to the third gray level conversion mode in a lookup table determined by the equation. Here, the input data may include video data and metadata.

Meanwhile, if the fourth gray level conversion mode is implemented, the high gray level amplifying unit 851 in the second reduction unit 790 may convert gray level based on data corresponding to the fourth gray level conversion mode in a lookup table.

Specifically, if the fourth gray level conversion mode is implemented, the high gray level amplifying unit 851 in the second reduction unit 790 may perform convert gray level based on an equation of input data and data corresponding to the fourth gray level conversion mode in a lookup table determined by the equation. Here, the input data may include video data and metadata.

For example, if the fourth gray level conversion mode is implemented in the high gray level amplifying unit 851 in the second reduction unit 790, the HDR processing unit 705 may implement the second gray level conversion mode.

For another example, if the third gray level conversion mode is implemented in the high gray level amplifying unit 851 in the second reduction unit 790, the HDR processing unit 705 may implement the first gray level conversion mode.

Alternatively, the high gray level amplifying unit 851 in the second reduction unit 790 may change a gray level conversion mode according to a gray level conversion mode in the HDR processing unit 705.

For example, if the second gray level conversion mode is implemented in the HDR processing unit 705, the high gray level amplifying unit 851 in the second reduction unit 790 may perform the fourth gray level conversion mode.

For another example, if the first gray level conversion mode is implemented in the HDR processing unit 705, the high gray level amplifying unit 851 in the second reduction unit 790 may implement the third gray level conversion mode.

Meanwhile, the HDR processing unit 705 according to an embodiment of the present disclosure may implement a gray level conversion mode so that low gray level and high gray level are converted uniformly.

Meanwhile, according to the second gray level conversion mode in the HDR processing unit 705, the second reduction unit 790 may implement the fourth gray level conversion mode and thereby amplify an upper limit on gray level of a received input signal. Accordingly, it is possible to improve high gray level expression for the input image.

Next, the first reduction unit 710 may perform noise reduction on an input image signal or an image signal processed by the HDR processing unit 705.

Specifically, the first reduction unit 710 may perform multiple stages of noise reduction processing and a first stage of gray level extension processing on an input image signal or an HDR image from the HDR processing unit 705.

To this end, the first reduction unit 710 may include a plurality of noise reduction parts 715 and 720 for reducing noise in multiple stages, and a first gray level extension part 725 for extending gray level.

Next, the enhancement unit 750 may perform multiple stages of image resolution enhancement processing on an image from the first reduction unit 710.

In addition, the enhancement unit 750 may perform object three-dimensional effect enhancement processing. In addition, the enhancement unit 750 may perform color or contrast enhancement processing.

To this end, the enhancement unit 750 may include: a plurality of resolution enhancement units 735, 738, 742 for enhancing a resolution of an image in multiple stages; an object three-dimensional effect enhancement unit 745 for enhancing a three-dimensional effect of an object; and a color contrast enhancement unit 749 for enhancing color or contrast.

Next, the second reduction unit 790 may perform a second stage of gray level extension processing based on a noise-reduced image signal received from the first reduction unit 710.

Meanwhile, the second reduction unit 790 may amplify an upper limit on gray level of an input signal, and extend a resolution of high gray level of the input signal. Accordingly, it is possible to improve high gray level expression for an input image.

For example, gray level extension may be performed uniformly on the entire gray level range of an input signal. Accordingly, gray level extension is performed uniformly on the entire area of an input image, thereby improving high gray level expression.

Meanwhile, the second reduction unit 790 may perform gray level amplification and extension based on a signal received from the first gray level extension part 725. Accordingly, it is possible to improve high gray level expression for an input image.

Meanwhile, if an input image signal input is an SDR image signal, the second reduction unit 790 may vary the degree of amplification based on a user input signal. Accordingly, it is possible to improve high gray level expression in response to a user setting.

Meanwhile, if an input image signal is an HDR image signal, the second reduction unit 790 may perform amplification according to a set value. Accordingly, it is possible to improve high gray level expression for an input image.

Meanwhile, if an input image signal is an HDR image signal, the second reduction unit 790 may vary the degree of amplification based on a user input signal. Accordingly, it is possible to improve high gray level expression according to a user setting.

Meanwhile, in the case of extending gray level based on a user input signal, the second reduction unit 790 may vary the degree of extension of gray level. Accordingly, it is possible to improve high gray level expression according to a user's setting.

Meanwhile, the second reduction unit 790 may amplify an upper limit on gray level according to a gray level conversion mode in the HDR processing unit 705. Accordingly, it is possible to improve high gray level expression for an input image.

The signal processing device 170 includes the HDR processing unit 705 configured to receive an image signal and adjust luminance of the input image signal, and the reduction unit 790 configured to amplify brightness of the image signal received from the HDR processing unit 705 and increase gray level resolution of the image signal to thereby generate an enhanced image signal. The enhanced image signal provides increased luminance and increased gray level resolution of the image signal while a high dynamic range in a displayed HDR image is maintained.

Meanwhile, the range of brightness of the image signal is adjusted by a control signal received by the signal processing device 170.

Meanwhile, the signal processing device 170 further includes an image analyzer configured to determine whether an input image signal is an HDR signal or an SDR signal, and generate a control signal to be provided to the HDR processor 705. The range of brightness of an input image signal is adjusted by a control signal only when the input image signal is an HDR signal.

Meanwhile, the control signal is received from a controller of an image display apparatus, which relates to signal processing, and the control signal corresponds to a setting of the image display apparatus.

Meanwhile, a resolution of gray level is increased based on amplification of adjusted brightness of an image signal.

Meanwhile, a resolution of gray level is increased based on a control signal received by the signal processing device 170.

Meanwhile, a control signal is received from a controller of an image display apparatus, which relates to signal processing, and the control signal corresponds to a setting of the image display apparatus.

Meanwhile, the reduction unit 790 may include the high gray level amplifying unit 851 configured to amplify an upper limit on gray level of an input signal, and a decontouring unit 842 and 844 configured to extend the resolution of gray level amplified by the high gray level amplifying unit 851.

The second reduction unit 790 may include a second gray level extension part 729 for a second stage of gray level extension.

Meanwhile, the image quality processing unit 635 in the signal processing device 170 according to the present disclosure is characterized in performing four stages of reduction processing and four stages of image enhancement processing, as shown in FIG. 8.

Here, the four stages of reduction processing may include two stages of noise reduction processing and two stages of gray level extension processing.

Herein, the two stages of noise reduction processing may be performed by the first and second noise reduction parts 715 and 720 in the first reduction unit 710, and the two stages of gray level extension processing may be performed by the first gray level extension part 725 in the first reduction unit 710 and the second gray level extension part 729 in the second reduction unit 790.

Meanwhile, the four stages of image enhancement processing may include three stages of image resolution enhancement (bit resolution enhancement) and object three-dimensional effect enhancement.

Here, the three stages of image enhancement processing may be performed by the first to third resolution enhancement units 735, 738, and 742, and the object three-dimensional effect enhancement may be performed by the object three-dimensional enhancement unit 745.

Meanwhile, the signal processing device 170 of the present disclosure may apply the same algorithm or similar algorithms to image quality processing multiple times, thereby enabled to gradually enhance an image quality.

To this end, the image quality processing unit 635 of the signal processing device 170 of the present disclosure may perform image quality processing by applying the same algorithm or similar algorithms two or more times.

Meanwhile, the same algorithm or the similar algorithms implemented by the image quality processing unit 635 have a different purpose to achieve in each stage. In addition, since image quality processing is performed gradually in multiple stages, there is an advantageous effect to cause fewer number of artifacts to appear in an image, resulting in a more natural and more vivid image processing result.

Meanwhile, the same algorithm or the similar algorithms are applied multiple times alternately with a different image quality algorithm, thereby bringing an effect more than simple continuous processing.

Meanwhile, the signal processing device 170 of the present disclosure may perform noise reduction processing in multiple stages. Each stage of noise reduction processing may include temporal processing and spatial processing.

Meanwhile, in order to calculate original quality of an image signal, the present disclosure uses the state-of-the-art technology such as artificial intelligence (AI). To this end, a Deep Neural Network (DNN) may be used.

The quality calculator 632 may calculate a resolution and a noise level of an input image signal using the DNN.

The quality calculator 632 may obtain an original resolution and a training image for each compression rate, and train the network so as to increase accuracy of the calculation.

A variety of images which can be commonly seen in ordinary broadcasting programs are provided as images used for the training, and thus, it is possible to cover any input environment.

Meanwhile, in order to reduce detection time or cost, the quality calculator 632 may perform learning using Convolutional Neural Network, Mobile-Net, and the like which has few number of layers.

For example, the quality calculator 632 may analyze only a region (e.g., 224×224, 128×128, 64×64, etc.) of an entire image.

Meanwhile, the quality calculator 632 may select a detection region appropriate for a purpose of detection.

For example, the quality calculator 632 may select a first region having the greatest number of edge components when detecting an original resolution, and select a second region having the least number of edge components when detecting noise.

In particular, the quality calculator 632 may apply an algorithm that selects a detection region in a short time in order to increase a processing speed.

For example, the quality calculator 632 may perform pre-processing such as Fast Fourier Transform (FFT) on a detection region.

FIG. 9A is a diagram showing calculation based on a Convolutional Neural Network (CNN).

Referring to the drawing, a convolutional neural network is used for a particular region 1015 in an acquired image 1010.

As the convolution neural network, a convolution network and a deconvolution network may be implemented.

According to the convolution neural network, convolution and pooling are performed repeatedly.

Meanwhile, according to the CNN scheme shown in FIG. 9A, information on the region 1015 may be used to determine types of pixels in the region 1015.

FIG. 9B is a diagram showing calculation based on Mobile-Net.

According to the scheme shown in the drawing, quality calculation is performed.

Meanwhile, as original quality changes, the signal processing device 170 of the present disclosure may apply an image quality setting corresponding to the changed quality in real time.

In particular, the signal processing device 170 may perform control apply, when the image quality setting is changed, the change of the image quality setting without any condition such as a channel change or an input change while an image is reproduced.

In this case, "real time" refers to employing a temporal processing technique including imaging infrared (IIR) and step movement.

Meanwhile, in order to upmix the downmix stereo audio signal and convert them to audio signal of multichannel, an Independent Component Analysis (ICA) method, a Primary Component Analysis (PCA) method that perform analysis using primary component and ambient component signals, a Nonnegative Matrix Factorization (NMF) method based on unsupervised learning, and the like may be used.

Meanwhile, according to the primary component analysis method (PCA) method, since the signal separated into the primary component and the ambient component is different from the original multichannel, it is impossible to match the primary component and the ambient component to the original multichannel signal.

For example, in a multi-channel play device, if the primary component is disposed in the front channel and the ambient components are evenly distributed in the entire channel, or if they are rendered in the rear, upstream channel, differently from the actual intention of the content creator, distorted spatial sound characteristic appears such that the audio object is positioned only in the front.

Accordingly, the present disclosure proposes an upmix method capable of synthesizing a multi-channel signal using a primary component analysis method (PCA) and a deep neural network (DNN) model. In particular, when upmixing a downmix stereo audio signal to a multi-channel audio signal, a method of improving spatial distortion is proposed. This will be described with reference to FIG. 10 or below.

Figure 10:
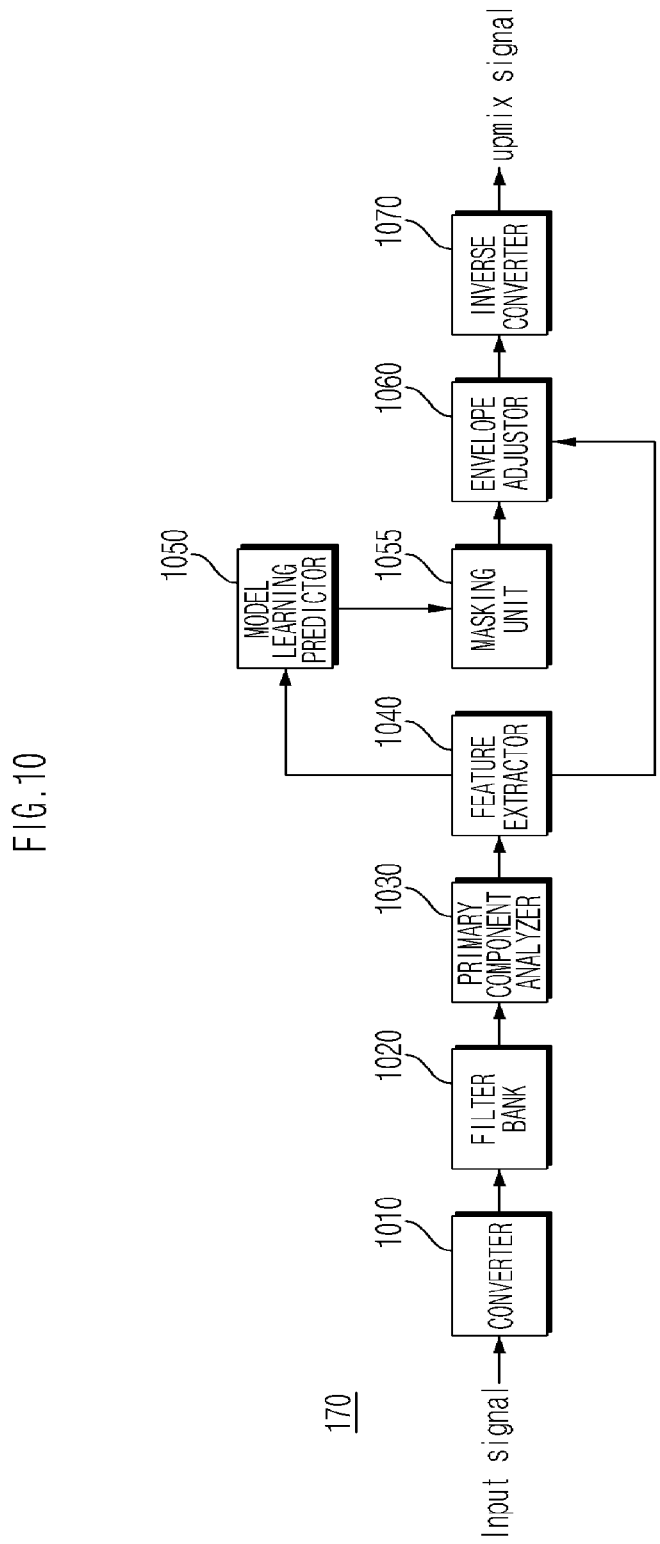
FIG. 10 is an example of an internal block diagram of a signal processing device according to an embodiment of the present disclosure.

FIG. 10 is an example of an internal block diagram of a signal processing device according to an embodiment of the present disclosure.

Referring to the drawing, in order to upmix a stereo audio signal to a multichannel audio signal, the signal processing device 170 may include a converter 1010, a filter bank 1020, a primary component analyzer 1030, a feature extractor 1040, a masking unit 1055, an envelope adjustor 1060, and an inverse converter 1070.

The converter 1010 may convert of frequency of an input stereo audio signal. For example, the converter 1010 may perform a Short Time Fourier Transform (STFT) for the input stereo audio signal.

Next, the filter bank 1020 may filter the frequency-converted stereo audio signal by using a plurality of band pass filters.

For example, the filter bank 1020 may include a filter bank such as a threshold band based on auditory characteristics, an octave band, and an equivalent rectangular bandwidth (ERB) of gamma tone, and perform a corresponding filtering.

Meanwhile, the filter bank 1020 may perform quadrature mirror filter (QMF) transformation.

Meanwhile, by the filter bank 1020, two-channel signal of stereo audio signal is analyzed in time and frequency band and is separated into a primary component signal that transmits main information such as speech and audio object, and an ambient component signal expressing reverberation and spatial impression.

Accordingly, it is possible to simplify the parameter required for upmix, and to reduce the computational complexity when analyzing through the deep neural network (DNN).

Meanwhile, a sound source separation method based on primary component analysis (PCA) may be expressed as in Equation 1.

$$x_1[i, k] = s_1[i, k] + n_1[i, k]$$
$$x_2[i, k] = s_2[i, k] + n_2[i, k]$$
$$s_2 = as_1$$

[Equation 1]

Here, s1[i,k], s2[i,k] may represent the primary component signal for the index i in the time domain and the band k in the frequency domain, respectively, n1[i,k], n2[i,k] may represent the index i of the time domain and the ambient component signal for the band k of the frequency domain, respectively, and a may represent a panning gain.

The primary component signal may represent a component having a high correlation between two channels of the stereo signal and having only a magnitude difference, and the ambient component signal may represent a component having a low correlation between two channels, such as a sound reflected by various paths or a reverberation sound.

In the primary component analysis method, since specific sources such as direct sound, speech, and musical instruments are separated into primary component, the intelligibility can be efficiently improved by panning for the front channel.

In addition, the primary component analysis method may be used for maximizing the spatial impression, since the background sound is separated into ambient component and rendered evenly over the entire channel.

However, when the primary component is panned to a section in which no primary component exists or to one side channel, performance may be degraded because the correlation is small.

In addition, the primary component signal for all channels such as the front, center, woofer, rear, and upstream channels is mixed in the estimated primary component signal, and the ambient components of all the original channels are mixed also in the ambient component.

Accordingly, the primary component analysis (PCA) method may be difficult to accurately render the component of corresponding original channel to each speaker of the multi-channel play apparatus. In addition, in the case of a stereo play apparatus, since the inaccurate multi-channel upmix has a limitation in improving the sound field through virtualization suitable for each channel, spatial distortion may occur differently from the intention of the content creator.

Meanwhile, since the method based on ICA, NMF, etc. also decomposes a signal based on the independent component and the base component, it is difficult to match to a multi-channel such as the actual front, center, woofer, rear, and upstream.

Recently, with respect to many hierarchical models, as technology of neural network research that can improve performance without falling into the local minima are developed, it is expanded to various fields such as classification, recognition, detection, retrieval, and the like of speech audio signal, in addition to speech recognition.

Accordingly, in the present disclosure, artificial intelligence (AI) image quality processing, artificial intelligence (AI) sound quality processing, etc. using a deep neural network (DNN) model are performed. In particular, it suggests an upmix scheme using a deep neural network (DNN) model.

To this end, it is necessary to learn a downmix audio signal or a multi-channel audio signal using a deep neural network (DNN) model. This will be described with reference to FIG. 11.

Meanwhile, the primary component analyzer 1030 may perform primary component analysis based on the signal from the converter 1010.

In particular, the primary component analyzer 1030 may perform a primary component analysis based on the signal from the filter bank 1020.

The feature extractor 1040 may extract a feature of the primary component signal based on the signal from the primary component analyzer 1030.

A model learning predictor 1050 may perform prediction based on the deep neural network model based on the feature from the feature extractor 1040.

The masking unit 1055 may perform masking with respect to the prediction result from the model learning predictor 1050.

When each channel of the multi-channel is independent of time and frequency, based on the prediction result from the model learning predictor 1050, the masking unit 1055 may perform masking by using time frequency component to perform channel separation.

The envelope adjustor 1060 may perform envelope adjustment based on predictions performed on the basis of a deep neural network model.

The envelope adjustor 1060 may separate the channel by correcting the envelope of a signal in the frequency band, according to a weight function for the frequency band, based on the prediction result from the model learning predictor 1050.

The envelope adjustor 1060 may adjust the size of each frequency band to follow the envelope in the target channel.

The inverse converter 1070 may inversely convert a signal from the envelope adjustor 1060 to output a multi-channel upmix audio signal.

Figure 11:
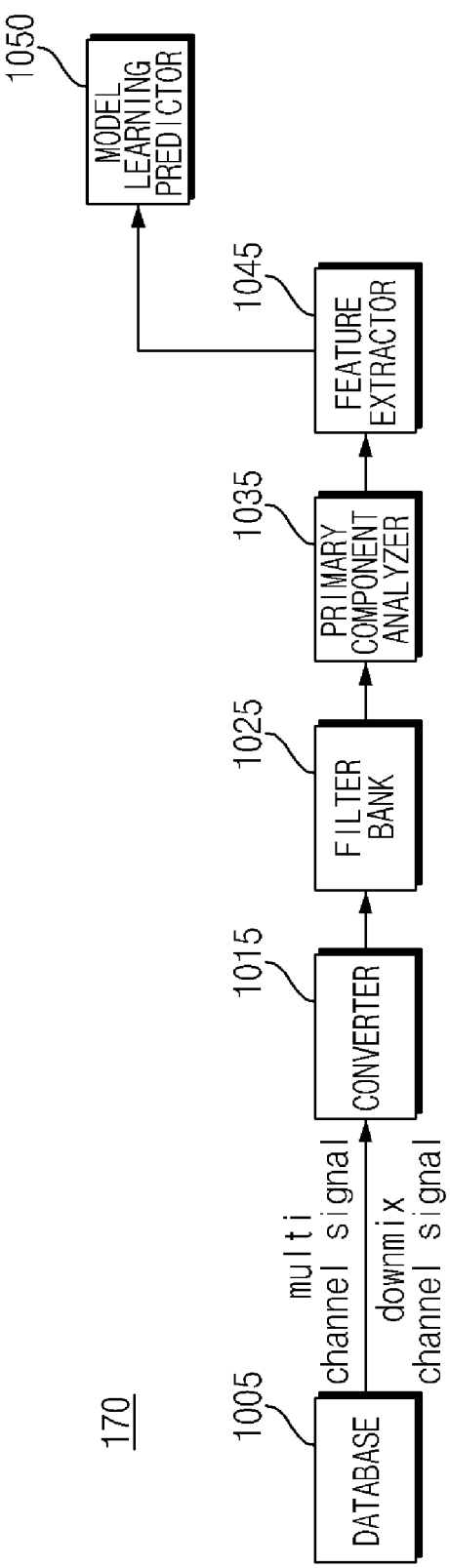
FIG. 11 is another example of an internal block diagram of a signal processing device according to an embodiment of the present disclosure.

FIG. 11 is another example of an internal block diagram of a signal processing device according to an embodiment of the present disclosure.

Referring to the drawing, in order to upmix a stereo audio signal to a multichannel audio signal, the signal processing device 170 may further include a second converter 1015, a second filter bank 1025, a second primary component analyzer 1035, and a second feature extractor 1045.

Meanwhile, a database 1005 may contain a downmix stereo audio signal and a multi-channel audio signal.

At this time, the database 1005 may be provided in the server 600 or the like.

Meanwhile, the second converter 1015 may convert of frequency of the downmix stereo audio signal or the multi-channel audio signal received from the database 1005.

For example, the second converter 1015 may perform a Short Time Fourier Transform (SIFT) for an input downmix stereo audio signal or a multi-channel audio signal.

Next, the second filter bank 1025 may filter the frequency-converted stereo audio signal by using a plurality of band pass filters.

For example, the second filter bank 1025 may include a filter bank such as a threshold band based on auditory characteristics, an octave band, an equivalent rectangular bandwidth (ERB) of gamma tone, and may perform a corresponding filtering.

Meanwhile, the second filter bank 1025 may perform quadrature mirror filter (QMF) conversion.

On the other hand, by the second filter bank 1025, the two-channel signal of stereo audio signal or the multi-channel audio signal is analyzed in time and frequency band, and may be separated into a primary component signal that transmits main information such as speech and audio object, and an ambient component signal expressing reverberation and spatial impression.

The second primary component analyzer 1035 may separate a primary component signal and an ambient component signal with respect to a two-channel signal of stereo audio signal or a multi-channel audio signal, and perform a correlation operation between channels of the primary component signal, a panning gain operation of the primary component signal, a power operation of the primary component signal, and the like.

Meanwhile, the second primary component analyzer 1035 may perform a correlation operation between channels of the ambient component signal, a panning gain operation of the ambient component signal, a power operation of the ambient component signal, and the like.

The second feature extractor 1045 may extract a feature such as a panning gain of the primary component signal, a power of the primary component signal, a panning gain of the ambient component signal, a power of the ambient component signal, and the like.

Meanwhile, the feature, or the like extracted by the second feature extractor 1045 may be input to the model learning predictor 1050.

Meanwhile, the model learning predictor 1050 may perform learning based on the deep neural network model based on the feature extracted by the second feature extractor 1045.

In particular, the model learning predictor 1050 may perform learning based on a deep neural network model based on features such as a panning gain of the primary component signal extracted by the second feature extractor 1045, and a power of the primary component signal.

Meanwhile, the model learning predictor 1050 may be provided in the signal processing device 170, but may also be provided in the server 600.

Meanwhile, the signal processing device 170 shown in FIG. 10 may convert a stereo audio signal into a multi-channel audio signal.

To this end, as described above, the signal processing device 170 shown in FIG. 10 may include the converter 1010, the filter bank 1020, the primary component analyzer 1030, the feature extractor 1040, the masking unit 1055, the envelope adjustor 1060, and the inverse converter 1070.

The converter 1010 may frequency convert the input downmix stereo audio signal.

Next, the filter bank 1020 may filter the frequency-converted stereo audio signal by using a plurality of band pass filters.

Next, the primary component analyzer 1030 separates the primary component signal and the ambient component signal with respect to the two-channel signal of the stereo audio signal, and performs a correlation operation between the channels of the primary component signal, a panning gain operation of the primary component signal, a power operation of the primary component signal, and the like.

Meanwhile, the primary component analyzer 1030 may perform a correlation operation between channels of the ambient component signal, a panning gain operation of the ambient component signal, a power operation of the ambient component signal, and the like.

Meanwhile, the feature extractor 1040 may extract a feature such as a panning gain of the primary component signal, a power of the primary component signal, a panning gain of the ambient component signal, a power of the ambient component signal, and the like.

Meanwhile, the feature extracted from the feature extractor 1040 may be input to the model learning predictor 1050.

Meanwhile, the model learning predictor 1050 may perform prediction based on the deep neural network model based on the feature extracted by the feature extractor 1040.

In particular, the model learning predictor 1050 may perform prediction based on a deep neural network model based on feature such as a panning gain of the primary component signal extracted by the feature extractor 1040, and a power of the primary component signal.

Meanwhile, the model learning predictor 1050 may be provided in the signal processing device 170, but may also be provided in the server 600.

Meanwhile, if the downmix input signal is ideally separated by the primary component analysis, it can be expressed as Equation 2, Equation 3.

$$s_d[i,k]=s_f[i,k]+s_c[i,k]+s_w[i,k]+s_r[i,k]+s_h[i,k] \quad \text{[Equation 2]}$$

$$n_d[i,k]=n_f[i,k]+n_r[i,k]+n_h[i,k] \quad \text{[Equation 3]}$$

Here, Sd, Sf, Sc, Sw, Sr, Sh represent the primary components of the downmix channel and the primary components of the front, center, woofer, rear, and upstream channels of the original multichannel respectively, and nd, nf, nr, nh represent the ambient component of the downmix channel and the front, rear, and upstream channels of the original multichannel respectively.

In the primary component of Equation 2, the primary components of the front, center, woofer, rear, and upstream channels are mixed. In particular, in the center and woofer signals, the primary component is prominent because the correlation is high by the downmix method.

In Equations 2 and 3, it is assumed that the multi-channel signal is a layout of 5.1.2 channel, but the multi-channel signal of another layout can be similarly expressed.

The masking unit 1055 may perform masking for the result predicted by the model learning predictor 1050.

When each channel in the multi-channel signal is statistically independent without relation in time and frequency, the masking unit 1055 may perform masking using time-frequency component to perform each channel separation as shown in Equation 4.

$$M_{s_x}[i,k] = \begin{cases} 1, & s_x[i,k] \in s_d[i,k] \\ 0, & \text{otherwise} \end{cases}, \quad \text{[Equation 4]}$$

$$M_{n_x}[i,k] = \begin{cases} 1, & n_x[i,k] \in n_d[i,k] \\ 0, & \text{otherwise} \end{cases},$$

Here, Msx and Mnx represent mask function of the primary component and the ambient component of the upmix channel, respectively.

The mask function is determined depending on the band of any channel of the original multichannel that is matched for the primary component and the ambient component of the input signal.

In the matching method, inclusion relationship can be easily known by the band power of the primary component and the ambient component of the multi-channel predicted from the model of the deep neural network (DNN).

Thus, the mask function may mean a function for separating the primary component Sd and the ambient component nd of the input downmix into the primary component Sx and the ambient component nx of the upmix channel.

The separated primary component and ambient component of the target channel are mixed as shown in Equation 5 to obtain a final upmix signal.

$$x_x[i,k]=s_d[i,k]M_{s_x}[i,k]+n_d[i,k]M_{n_x}[i,k] \quad \text{[Equation 5]}$$

When the binary mask of the rectangular window is used as described above, it has good performance in the objective evaluation, but has a disadvantage of severe distortion in terms of subjective sound quality.

Thus, a gaussian filter may be used to improve the auditory unnatural distortion.

However, since the actual multi-channel signal does not have reciprocal treacherous characteristic, it cannot cope completely in the form of a simple mask.

As a result, the envelope adjustor 1060 can adjust the envelope of a signal output by masking.

That is, the envelope adjustor 1060 may separate the channel by using a weight function as shown in Equation 6. Thus, a more natural output can be obtained.

$$W_{s_x}[i,k] = \arg\min_{W_{s_x}[i,k]}\{s_x[i,k] - s_d[i,k]W_{s_x}[i,k]\}, \quad \text{[Equation 6]}$$

$$W_{n_x}[i,k] = \arg\min_{W_{n_x}[i,k]}\{n_x[i,k] - n_d[i,k]W_{n_x}[i,k]\}$$

Here, Wsx and Wnx represent primary component weight and ambient component weight functions for the target channel, respectively.

The weight function represents a weight function that minimizes the error between the primary component and the ambient component signal with respect to the signal of the target upmix channel and the downmix signal.

Thus, the weight function for the frequency band can be regarded as correcting the envelope of the signal in the frequency band.

That is, the envelope adjustor 1060 may adjust the envelope, by calculating weight of the primary component and the ambient component envelopes of the multi-channel.

The final upmix signal to which the weight function is applied is generated as shown in Equation 7.

$$x_x[i,k]=s_d[i,k]W_{s_x}[i,k]+n_d[i,k]W_{n_x}[i,k]$$ [Equation 7]

In order to adjust the envelope, the upmix parameter may be predicted from a model of the deep neural network DNN in the model learning predictor 1050.

Accordingly, the multi-channel upmix performance may be degraded according to the deep neural network (DNN) learning performance in the model learning predictor 1050.

Meanwhile, the envelope adjustor 1060 may adjust the size of each frequency band to follow the envelope of the target channel. In this case, since only the size information of the primary component and the ambient component bands need to be estimated as the feature vector, there is an advantage in implementation.

In addition, since a weight function optimized from a deep neural network (DNN) model can be applied to the primary component and ambient component estimated by the conventional primary component analysis method, there is an advantage in that real-time tuning is possible.

Meanwhile, the inverse converter 1070 may inversely convert a signal output from the envelope adjustor 1060 to output a multichannel upmix audio signal.

Accordingly, when upmixing a downmix stereo audio signal to a multichannel audio signal, spatial distortion can be improved.

Figure 12:
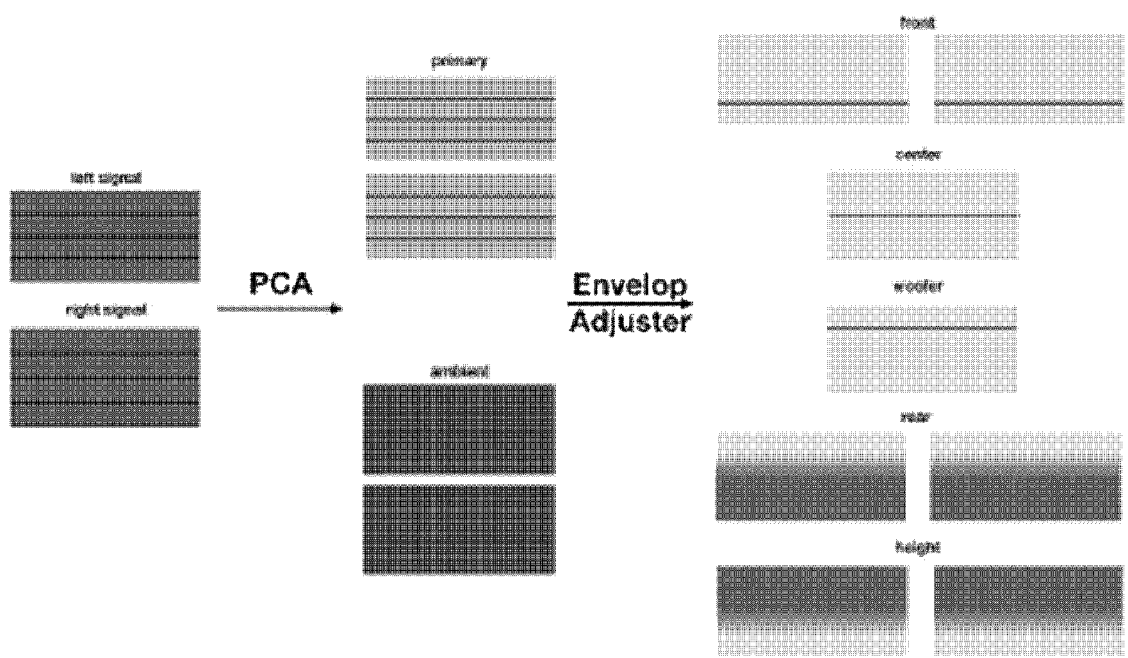
FIG. 12 is a diagram referred to the description of FIGS. 10 to 11.

FIG. 12 is a diagram referred to the description of FIGS. 10 to 11.

Referring to the drawing, the stereo input signal (left signal, right signal) may be separated into a primary component signal (primary) and an ambient component signal (ambient) by the primary component analyzer 1030.

Further, it may be upmixed into a multi-channel signal via the envelope adjustor 1060 or the like.

Meanwhile, the front, center, and woofer channels of the multi-channel audio signal are not related to each other with respect to the frequency domain. In addition, since the left and right channels have high correlation with the same signal, the left and right channels can be decomposed into primary component.

Meanwhile, the rear and upstream channels may be decomposed into ambient component because the correlation between the left and right channels is low.

Meanwhile, the weight function predicted in the deep neural network model are applied to the primary component and the ambient component decomposed by the envelope adjustor 1060 to generate an upmix channel.

Figure 14:
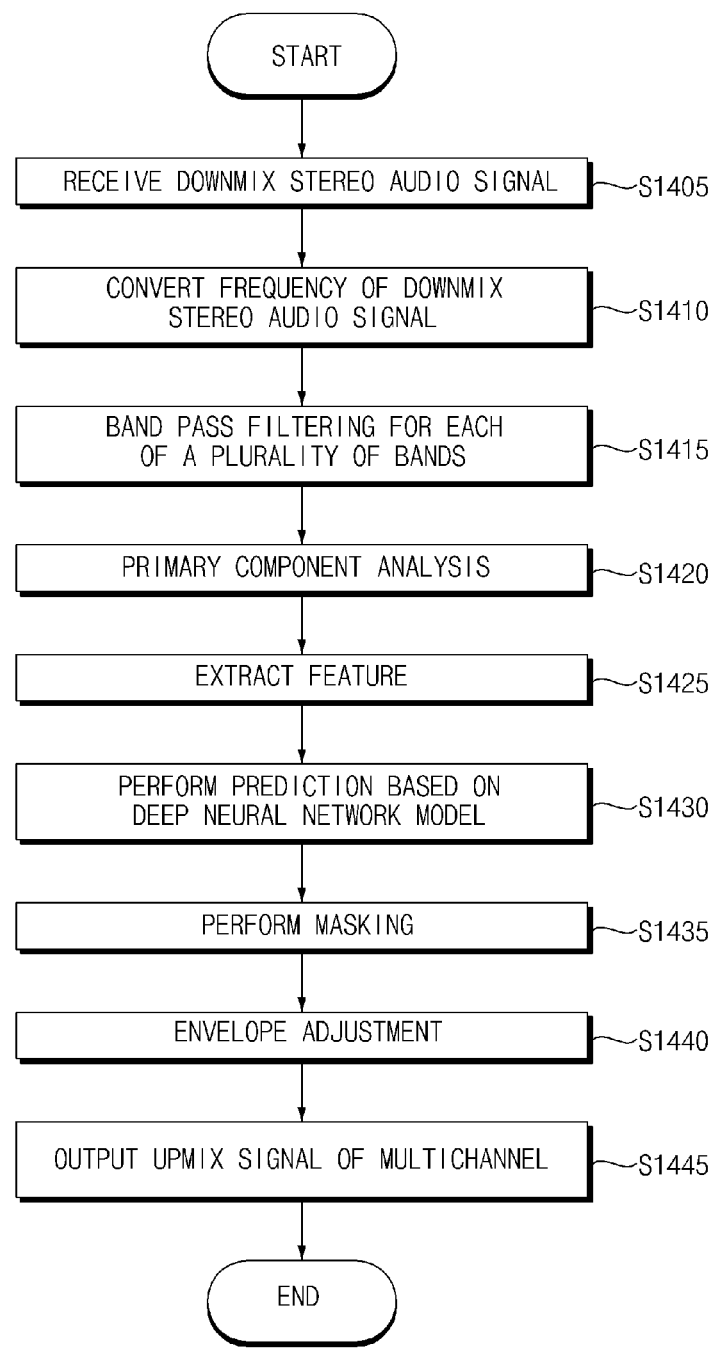
FIG. 14 is a flowchart illustrating an operation of a signal processing device according to another embodiment of the present disclosure.

FIG. 14 is a flowchart illustrating an operation of a signal processing device according to an embodiment of the present disclosure.

Referring to the drawing, the signal processing device 170 may receive an input stereo signal (S1405). In particular, it is possible to receive downmix stereo signal.

Next, the converter 1030 in the signal processing device 170 may convert frequency of the input stereo audio signal (S1410).

As described above, the input stereo audio signal may be converted by using Short time Fourier Transform (SIFT).

Next, the filter bank 1020 may filter the frequency-converted stereo audio signal by using a plurality of band pass filters (S1415).

Next, the primary component analyzer 1030 may perform primary component analysis based on the signal from the converter 1010 (S1420).

In particular, the primary component analyzer 1030 may perform primary component analysis based on the signal from the filter bank 1020.

Next, the feature extractor 1040 may extract a feature of the primary component signal based on the signal from the primary component analyzer 1030 (S1425).

Next, the model learning predictor 1050 may perform prediction based on the deep neural network model based on the feature from the feature extractor 1040 (S1430).

Next, the masking unit 1055 may perform masking for the prediction result from the model learning predictor 1050 (S1435).

Meanwhile, when each channel of the multi-channel is independent of time and frequency, the masking unit 1055 performs masking with a time frequency component may perform channel separation based on a prediction result from the model learning predictor 1050.

Next, the envelope adjustor 1060 may perform envelope adjustment based on the prediction performed based on the deep neural network model (S1440).

Meanwhile, based on the prediction result from the model learning predictor 1050, the envelope adjustor 1060 may separate the channel by correcting the envelope of the signal in the frequency band according to a weight function for the frequency band.

Meanwhile, the envelope adjustor 1060 may adjust the size of each frequency band to follow the envelope in the target channel.

Next, the inverse converter 1070 may inversely convert the signal from the envelope adjustor 1060 to output a multichannel upmix audio signal.

Accordingly, when upmixing a downmix stereo audio signal to a multichannel audio signal, spatial distortion can be improved. In particular, multi-channel signal can be easily synthesized using the primary component analysis method and the deep neural network model.

Figure 13:
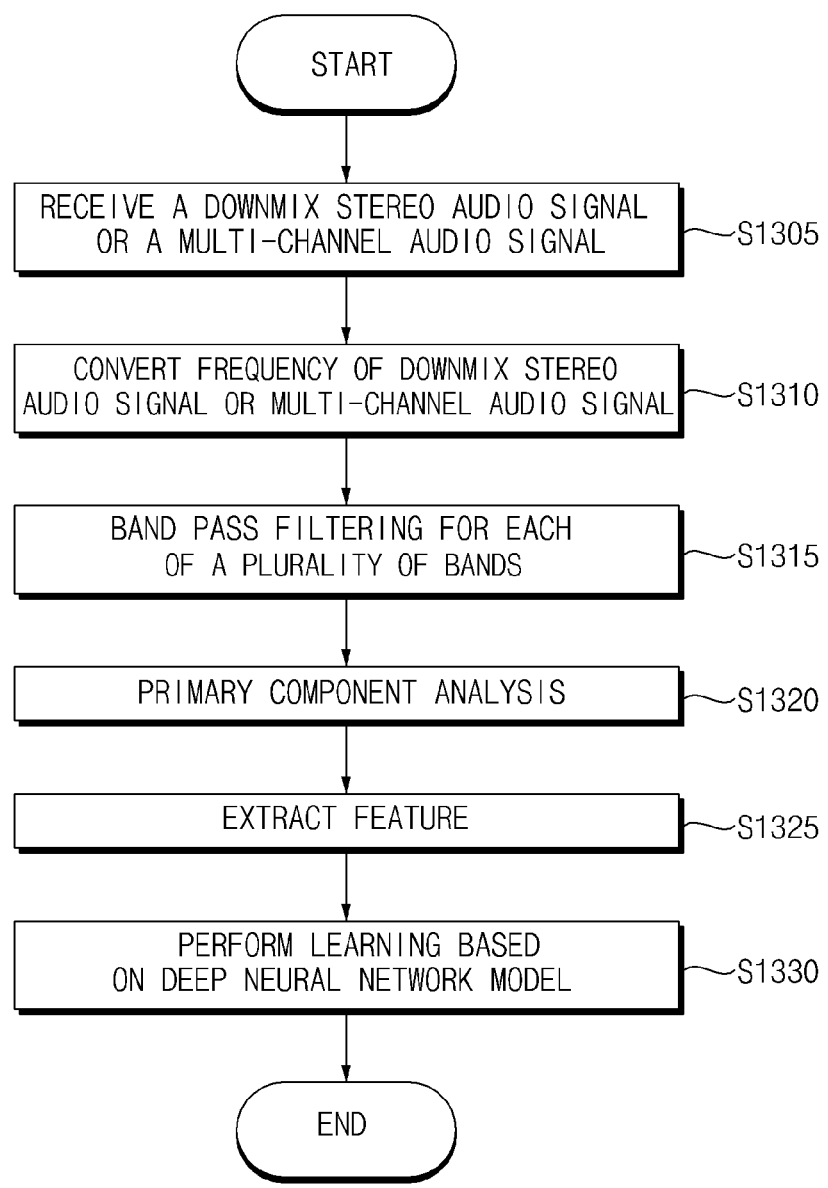
FIG. 13 is a flowchart illustrating an operation of a signal processing device according to an embodiment of the present disclosure.

FIG. 13 is a flowchart illustrating an operation of a signal processing device according to another embodiment of the present disclosure.

Referring to the drawing, the signal processing device 170 may receive a downmix stereo audio signal or a multi-channel audio signal received from the database 1005 (S1305).

Next, the second converter 1015 in the signal processing device 170 may convert frequency of the downmix stereo audio signal or the multi-channel audio signal received from the input database 1005 (S1310). As described above, the input stereo audio signal may be converted by using Short time Fourier Transform (SIFT).

Next, the second filter bank 1025 may filter the frequency-converted stereo audio signal by using a plurality of band pass filters (S1315).

Next, the second primary component analyzer 1035 may perform primary component analysis based on the signal from the second converter 1015 (S1320).

In particular, the second primary component analyzer 1035 may perform a primary component analysis based on a signal from the second filter bank 1025.

Next, the second feature extractor 1045 may extract a feature of the primary component signal based on the signal from the second primary component analyzer 1035 (S1325).

Next, the model learning predictor 1050 may perform learning based on the deep neural network model based on the feature from the second feature extractor 1045 (S1330).

Accordingly, learning is performed based on the deep neural network model, so that accurate prediction can be performed in the multi-channel prediction of FIG. 13.

Meanwhile, the upmix channel generation of the audio signal of the signal processing device 170 can be applied to any play apparatus such as a portable play apparatus, a home theater, a sound bar, a car audio, or the like capable of playing audio content, in addition to an image display apparatus such as a TV, a mobile terminal, a vehicle display apparatus.

In particular, a multi-channel play apparatus, such as a home theater, a car audio, can generate a multi-channel audio signal that can be output to each speaker.

In addition, even in a portable play apparatus for playing an earphone and a headphone, an immersive audio environment can be reproduced by linking a 3D multi-channel signal with externalization technology.

In addition, even the play apparatus of two-channel speaker in the form of TV and sound bar can be combined with a multi-channel virtualization technology to reproduce further enhanced three-dimensional audio.

As is apparent from the above description, a signal processing device and an image display apparatus including the same according to an embodiment of the present disclosure include: a converter configured to convert of frequency of an input stereo audio signal; a primary component analyzer configured to perform primary component analysis based on a signal from the converter; a feature extractor configured to extract a feature of a primary component signal based on a signal from the primary component analyzer; an envelope adjustor configured to perform envelope adjustment based on prediction performed on the basis of a deep neural network model; and an inverse converter configured to inversely convert a signal from the envelope adjustor to output an upmix audio signal of multi-channel. Accordingly, when upmixing the downmix stereo audio signal to a multichannel audio signal, spatial distortion can be improved. In particular, multi-channel signals can be easily synthesized using a primary component analysis methods and a deep neural network model.

The signal processing device and an image display apparatus including the same according to an embodiment of the present disclosure further include a filter bank configured to filter the frequency-converted stereo audio signal from the converter by a plurality of band pass filters. Accordingly, when upmixing the downmix stereo audio signal to a multichannel audio signal, spatial distortion can be improved.

The signal processing device and an image display apparatus including the same according to an embodiment of the present disclosure further include a model learning predictor configured to perform the prediction based on the deep neural network model based on the feature from the feature extractor. Accordingly, when upmixing the downmix stereo audio signal to a multichannel audio signal, spatial distortion can be improved.

The signal processing device and an image display apparatus including the same according to an embodiment of the present disclosure further include a masking unit configured to perform masking for prediction result from a model learning predictor. Accordingly, when upmixing the downmix stereo audio signal to a multichannel audio signal, spatial distortion can be improved.

The masking unit performs masking by using time-frequency component to perform channel separation based on the prediction result from the model learning predictor, when each channel of multichannel is independent of time and frequency. Accordingly, when upmixing the downmix stereo audio signal to a multichannel audio signal, spatial distortion can be improved.

The envelope adjustor separates a channel by correcting an envelope of a signal in a frequency band, according to a weight function for a frequency band, based on a prediction result from a model learning predictor. Accordingly, when upmixing the downmix stereo audio signal to a multichannel audio signal, spatial distortion can be improved.

The envelope adjustor adjusts a size of each frequency band to follow an envelope in a target channel. Accordingly, when upmixing the downmix stereo audio signal to a multichannel audio signal, spatial distortion can be improved.

The primary component analyzer separates a primary component signal and a sub component signal of the input stereo audio signal. Accordingly, when upmixing the downmix stereo audio signal to a multichannel audio signal, spatial distortion can be improved.

The primary component analyzer performs at least one of a correlation operation between channels of primary component signal of the input stereo audio signal, a panning gain operation of primary component signal, and a power operation of primary component signal. Accordingly, when upmixing the downmix stereo audio signal to a multichannel audio signal, spatial distortion can be improved.

The feature extractor extracts a panning gain of the primary component signal of the input stereo audio signal and a power of the primary component signal. Accordingly, when upmixing the downmix stereo audio signal to a multichannel audio signal, spatial distortion can be improved.

The signal processing device and an image display apparatus including the same according to an embodiment of the present disclosure further include a second converter configured to convert of frequency of a downmix stereo audio signal or a multi-channel audio signal received from a database; a second primary component analyzer configured to perform primary component analysis based on a signal from the second converter; and a second feature extractor configured to extract a feature of the primary component signal based on the signal from the second primary component analyzer; wherein learning is performed based on the deep neural network model based on the feature extracted by the second feature extractor. Accordingly, learning can be performed based on a deep neural network model.

The signal processing device and an image display apparatus including the same according to an embodiment of the present disclosure further include a model learning predictor configured to perform learning based on the deep neural network model based on the feature extracted by the second feature extractor. Accordingly, learning can be performed based on a deep neural network model.

Although the preferred embodiments of the present disclosure have been disclosed for illustrative purposes, those skilled in the art will appreciate that various modifications, additions and substitutions are possible, as disclosed in the accompanying claims. Accordingly, such modifications, additions and substitutions should also be understood to fall within the scope of the present disclosure.

What is claimed is:

1. A signal processing device comprising:
a processor configured to:

convert a frequency of an input stereo audio signal;
perform primary component analysis based on the input stereo audio signal;
extract a feature of a primary component signal based on primary component analysis results, wherein the primary component signal is associated with the input stereo audio signal;
perform envelope adjustment by performing a prediction with a deep neural network model based on the extracted feature; and
inversely convert a signal for outputting a multi-channel audio signal based at least in part on the envelope adjustment.

2. The signal processing device of claim 1, wherein the processor is further configured to filter the converted input stereo audio signal by using a plurality of band pass filters.

3. The signal processing device of claim 1, wherein the input stereo audio signal is converted by using a Short time Fourier Transform.

4. The signal processing device of claim 1, wherein the processor is further configured to perform masking with respect to a prediction result from a model learning predictor.

5. The signal processing device of claim 4, wherein the processor is further configured to perform masking by using time-frequency component to perform channel separation based on the prediction result from the model learning predictor when each channel of the multi-channel audio signal is independent of time and frequency.

6. The signal processing device of claim 1, wherein the processor is further configured to separate a channel by correcting an envelope of a signal in a frequency band of the primary component signal according to a weight function for the frequency band based on a prediction result from a model learning predictor.

7. The signal processing device of claim 1, wherein the processor is further configured to separate the input stereo audio signal into the primary component signal and a sub-component signal.

8. The signal processing device of claim 7, wherein the processor is further configured to adjust a size of a frequency band for both the primary component signal and for the sub-component signal to follow an envelope in a target channel.

9. The signal processing device of claim 1, wherein the processor is further configured to perform at least one of a correlation operation between channels of the primary component signal, a panning gain operation of the primary component signal, or a power operation of the primary component signal.

10. The signal processing device of claim 1, wherein the processor is further configured to extract at least one of a panning gain of the primary component signal or a power of the primary component signal.

11. The signal processing device of claim 1,
wherein the processor is further configured to: convert a frequency of a downmix stereo audio signal or a multi-channel audio signal received from a database;
perform primary component analysis based on a third signal; and
a extract a second feature of the primary component signal based on the third signal,
wherein learning is performed based on the deep neural network model based on the extracted second feature.

12. The signal processing device of claim 11, further comprising a model learning predictor configured to perform learning based on the deep neural network model based on the feature extracted.

13. An image display apparatus comprising:
a display;
an audio output device; and
a signal processing device configured to be electrically connected to the display and the audio output device, wherein the signal processing device outputs an image signal to the display and outputs an audio signal to the audio output device,
wherein the signal processing device comprises a processor configured to:
convert a frequency of an input stereo audio signal;
perform primary component analysis based on the input stereo audio signal;
extract a feature of a primary component signal based on primary component analysis results, wherein the primary component signal is associated with the input stereo audio signal;
perform envelope adjustment by performing a prediction with a deep neural network model based on the extracted feature; and
inversely convert a signal for outputting a multi-channel audio signal based on the envelope adjustment.

14. The image display apparatus of claim 13, wherein the processor is further configured to filter the converted input stereo audio signal by using a plurality of band pass filters.

15. The image display apparatus of claim 13, wherein the input stereo audio signal is converted by using a Short time Fourier Transform.

16. The image display apparatus of claim 13, wherein the processor is configured to perform masking with respect to a prediction result from a model learning predictor.

17. The image display apparatus of claim 16, wherein the processor is further configured to perform masking by using time-frequency component to perform channel separation based on the prediction result from the model learning predictor when each channel of the multi-channel audio signal is independent of time and frequency.

18. The image display apparatus of claim 13, wherein the processor is further configured to separates a channel by correcting an envelope of a signal in a frequency band according to a weight function for the frequency band based on a prediction result from a model learning predictor.

19. The image display apparatus of claim 13, wherein the processor is further configured to:
convert a frequency of a downmix stereo audio signal or a multi-channel audio signal received from a database;
perform primary component analysis based on a third signal; and
extract a second feature of the primary component signal based on the third signal,
wherein learning is performed based on the deep neural network model based on the extracted second feature.

20. The image display apparatus of claim 19, wherein the signal processing device further comprises a model learning predictor configured to perform learning based on the deep neural network model based on the extracted feature extracted.

* * * * *